(12) United States Patent
Watanabe et al.

(10) Patent No.: US 11,283,417 B2
(45) Date of Patent: Mar. 22, 2022

(54) AMPLIFICATION CIRCUIT, IMAGING DEVICE, AND CONTROL METHOD OF AMPLIFICATION CIRCUIT

(71) Applicant: Sony Semiconductor Solutions Corporation, Kanagawa (JP)

(72) Inventors: Shinichi Watanabe, Kanagawa (JP); Takehiro Otani, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/971,997

(22) PCT Filed: Dec. 4, 2018

(86) PCT No.: PCT/JP2018/044525
§ 371 (c)(1),
(2) Date: Aug. 21, 2020

(87) PCT Pub. No.: WO2019/171686
PCT Pub. Date: Sep. 12, 2019

(65) Prior Publication Data
US 2021/0006212 A1    Jan. 7, 2021

(30) Foreign Application Priority Data

Mar. 5, 2018    (JP) .............................. JP2018-038161

(51) Int. Cl.
*H04N 5/374* (2011.01)
*H04N 5/378* (2011.01)
(Continued)

(52) U.S. Cl.
CPC ........... *H03F 3/16* (2013.01); *H04N 5/37457* (2013.01); *H04N 5/363* (2013.01); *H04N 5/378* (2013.01)

(58) Field of Classification Search
CPC ....... H03F 3/16; H03F 3/082; H04N 5/37457; H04N 5/378; H04N 5/363; H01L 27/146
(Continued)

(56) References Cited

U.S. PATENT DOCUMENTS 6,208,278 B1 *   3/2001  Toosky ................. H03M 1/661
                                                                341/138
10,924,015 B2 *  2/2021  Muralidharan .......... H03G 3/10
(Continued)

FOREIGN PATENT DOCUMENTS

JP      2011029726 A     2/2011
JP      2016504894 A     2/2016
JP      2016171466 A     9/2016

OTHER PUBLICATIONS

International Search Report and Written Opinion of dated Feb. 26, 2019 for corresponding International Application No. PCT/JP2018/044525.

*Primary Examiner* — Marly S Camargo
(74) *Attorney, Agent, or Firm* — Michael Best & Friedrich LLP

(57) ABSTRACT

A decline in image quality that is caused by a variation of a gain in an amplification circuit is suppressed.

The amplification circuit includes an amplification transistor, a cascode transistor, and a control circuit. The amplification transistor amplifies an input signal. The cascode transistor is configured to, in a case where a drain-source voltage between a drain and a source is higher than a predetermined voltage, supply a substantially-constant drain current to a reference potential line with a predetermined reference potential via the amplification transistor. Further, the control circuit is configured to, in a case where an initialization instruction is issued, control the drain-source voltage to be a value higher than the predetermined voltage.

18 Claims, 20 Drawing Sheets

(51) Int. Cl.
     *H04N 5/363*     (2011.01)
     *H03F 3/08*      (2006.01)
     *H03F 3/16*      (2006.01)
     *H03M 1/74*     (2006.01)
     *H01L 27/146*   (2006.01)
     *H04N 5/3745*   (2011.01)

(58) Field of Classification Search
     USPC .... 348/300, 301, 302, 308, 294, 297, 229.1,
                348/231.99, 231.9; 257/291, 292, 293,
                257/159, 443, 271; 250/208.1, 214 A,
                       250/214 LA; 330/261, 264
     See application file for complete search history.

(56) References Cited

U.S. PATENT DOCUMENTS

| | | | | |
|---|---|---|---|---|
| 2006/0119435 A1* | 6/2006 | Oh | ............................ | H03F 3/72 |
| | | | | 330/311 |
| 2010/0188154 A1* | 7/2010 | Yeung | ................... | H03F 1/0277 |
| | | | | 330/295 |
| 2012/0105157 A1* | 5/2012 | Ahn | ......................... | H03F 3/72 |
| | | | | 330/285 |
| 2014/0210554 A1* | 7/2014 | Abdelhalem | ........ | H03N 1/0205 |
| | | | | 330/296 |
| 2016/0268682 A1* | 9/2016 | Sugizaki | ................. | H03F 3/082 |
| | | | | 330/308 |
| 2016/0268982 A1 | 9/2016 | Sugizaki et al. | | |

\* cited by examiner

AMPLIFICATION CIRCUIT, IMAGING DEVICE, AND CONTROL METHOD OF AMPLIFICATION CIRCUIT

TECHNICAL FIELD

The present technology relates to an amplification circuit, an imaging device, and a control method of an amplification circuit. More specifically, the present technology relates to an amplification circuit that amplifies a single-ended signal, an imaging device, and a control method of an amplification circuit.

BACKGROUND ART

In an electronic device such as an imaging device, an amplification circuit has been conventionally used for amplifying a signal. For example, there has been proposed a CMOS image sensor (CIS) in which an amplification circuit that amplifies a single-ended signal from a pixel, and an analog to digital (AD) converter that performs AD conversion of the amplified signal are arranged for each column (e.g., refer to Non patent Document 1.). In this prior art, two n-channel MOS (nMOS) transistors connected in series between a power source and a reference potential (ground, etc.), and a switch that connects an input terminal to an output terminal in initialization of a gain are arranged in an amplification circuit. Among these two nMOS transistors, a gate of a grounding side transistor is connected to an input node and a drain of a power source side transistor is connected to an output node.

CITATION LIST

Non Patent Document

Non Patent Document 1: Assim Boukhayma, et al., A Correlated Multiple Sampling Passive Switched Capacitor Circuit for Low Light CMOS Image, International Conference on Noise and Variations 2015.

SUMMARY OF THE INVENTION

Problems to be Solved by the Invention

In the above-described prior art, because the amplification circuit amplifies a single-ended signal that has not been subjected to AD conversion, even if the single-ended signal is weak, pixel data can be read out. Nevertheless, when an electric charge of a capacitor that determines a gain of the amplification circuit is initialized, there is a possibility that the initialization fails to be fully performed and a noise component is generated. This is because, when an electric potential of an input signal is low, a drain-source voltage of the power source side nMOS transistor drops in initialization, the transistor operates in a linear region, and a gain of an amplifier drastically decreases. This brings about such a problem that, even in a case where there is the same pixel signal, an error is generated between column amplifiers, and image quality declines.

The present technology has been devised in view of such a situation, and aims to suppress a decline in image quality that is caused by a variation of a gain in an amplification circuit.

Solutions to Problems

The present technology is made to clear the above-described problems and according to a first aspect of the present technology, there are provided an amplification circuit and a control method thereof including an amplification transistor configured to amplify an input signal, a cascode transistor configured to, in a case where a drain-source voltage between a drain and a source is higher than a predetermined voltage, supply a substantially-constant drain current to a reference potential line with a predetermined reference potential via the amplification transistor, and a control circuit configured to, in a case where an initialization instruction is issued, control the drain-source voltage to be a value higher than the predetermined voltage. With this arrangement, in a case where the drain-source voltage between the drain and the source is higher than the predetermined voltage, a transistor operates in a saturated region, and a high gain is kept. This arrangement brings about such an effect that initialization of an electric charge of a capacitor that determines a gain of the amplification circuit in initialization can be performed nearly-completely, and an error between column amplifiers can be suppressed.

In addition, in the first aspect, the control circuit may include a source follower transistor configured to supply an electric potential higher than an electric potential of a source to the drain of the cascode transistor, and an input side switch configured to, in a case where the initialization instruction is issued, connect the source of the source follower transistor and an input node to which the input signal is input, and in a case where the initialization instruction is not issued, separate the source from the input node, and the drain may be connected to an output node to which the amplified input signal is output. This arrangement brings about such an effect that, in a case where the initialization instruction is issued, the input signal is input to the source of the source follower transistor.

Further, in the first aspect, the control circuit may further include an output side switch configured to, in a case where the initialization instruction is issued, connect the gate of the source follower transistor and the output node, and in a case where the initialization instruction is not issued, separate the gate from the output node, and the source follower transistor may supply an electric potential of the gate that is higher than an electric potential of the source, via the output side switch. This arrangement brings about such an effect that, in a case where the initialization instruction is not issued, the gate of the source follower transistor is separated from the output node.

Further, in the first aspect, the control circuit may further include a bias control switch configured to, in a case where the initialization instruction is not issued, connect the gate of the source follower transistor and a bias potential supply source configured to supply a predetermined bias potential. This arrangement brings about such an effect that, in a case where the initialization instruction is not issued, the predetermined bias potential is supplied to the gate of the source follower transistor.

In addition, according to a second aspect of the present technology, there is provided an imaging device including an amplification transistor configured to amplify an input signal, a current source transistor configured to, in a case where a drain-source voltage between a drain and a source is higher than a predetermined voltage, supply a substantially-constant drain current to a reference potential line with a predetermined reference potential via the amplification transistor, a control circuit configured to, in a case where an initialization instruction is issued, control the drain-source voltage to be a value higher than the predetermined voltage, and a pixel configured to photoelectrically convert incident light and supply the photoelectrically-converted incident light to the amplification transistor as the input signal. This arrangement brings about such an effect that, in a case where the initialization instruction is issued, the substantially-constant drain current is supplied to the reference potential line, and the input signal from the pixel is amplified.

Further, in the second aspect, the control circuit may include a source follower transistor configured to supply an electric potential higher than an electric potential of a source to the drain of the cascode transistor, and an input side switch configured to, in a case where the initialization instruction is issued, connect the source of the source follower transistor and an input node to which the input signal is input, and in a case where the initialization instruction is not issued, separate the source from the input node, and the drain may be connected to an output node to which the amplified input signal is output. This arrangement brings about such an effect that, in a case where the initialization instruction is issued, the input signal is input to the source of the source follower transistor.

Further, in the second aspect, a timing control unit configured to control an operation timing of the input side switch may further be included. This arrangement brings about such an effect that an operation timing of the input side switch is controlled by the timing control unit.

Further, in the second aspect, the control circuit may further include an output side switch configured to, in a case where the initialization instruction is issued, connect the gate of the source follower transistor and the output node, and in a case where the initialization instruction is not issued, separate the gate from the output node, the source follower transistor may supply an electric potential of the gate that is higher than an electric potential of the source, via the output side switch, and the timing control unit may cause the input side switch and the output side switch to operate at different respective timings. This arrangement brings about such an effect that the input side switch and the output side switch are controlled at different respective timings.

Further, in the second aspect, the control circuit may further include a bias control switch configured to, in a case where the initialization instruction is not issued, connect the gate of the source follower transistor and a bias potential supply source configured to supply a predetermined bias potential, and the timing control unit may cause the input side switch, the output side switch, and the bias control switch to operate at different respective timings. This arrangement brings about such an effect that the input side switch, the output side switch, and the bias control switch are controlled at different respective timings.

Effects of the Invention

According to the present technology, such an excellent effect that a gain of an amplifier can be kept high in initialization, and a decline in image quality that is caused by a variation of the gain can be suppressed can be obtained. Note that in this connection, the effects described here are not necessarily limited, and may be any of the effects described in the present disclosure.

MODE FOR CARRYING OUT THE INVENTION

Hereinafter, a mode for implementing the present technology (hereinafter referred to as an embodiment) will be described. Explanations will be given as the following order.

1. First Embodiment (Example of Raising Gate-Source Voltage in Initialization)

2. Second Embodiment (Example of Raising Gate-Source Voltage in Initialization and Separating Transistor after Initialization)

3. Third Embodiment (Example of Raising Gate-Source Voltage in Initialization and Supplying Bias Potential to Transistor after Initialization)

4. Modified Example

1. First Embodiment

[Configuration Example of Imaging Device]

Figure 1:
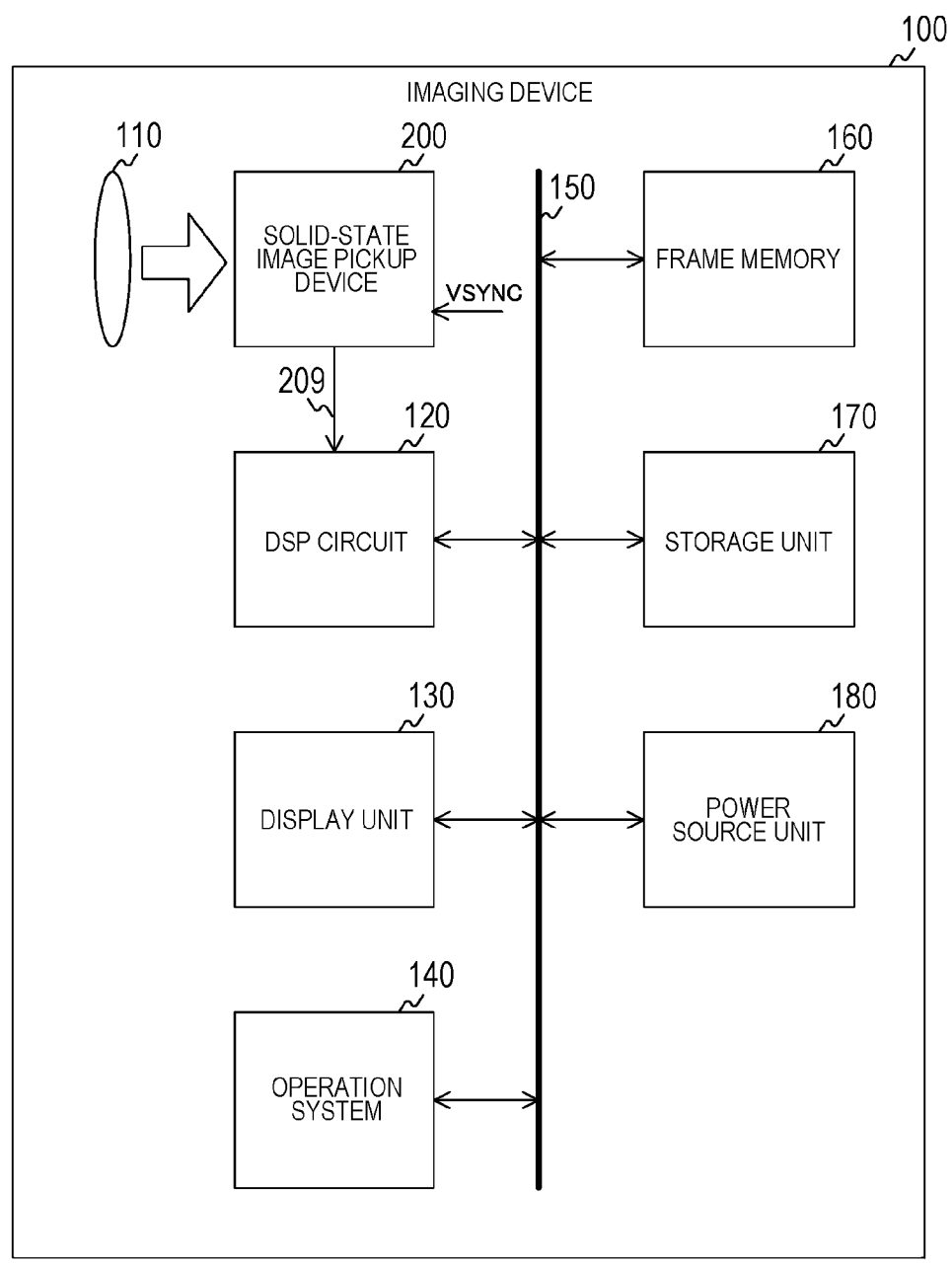
FIG. 1 is a block diagram illustrating a configuration example of an imaging device according to a first embodiment of the present technology.

FIG. 1 is a block diagram illustrating a configuration example of an imaging device 100 according to a first embodiment of the present technology. The imaging device 100 is a device for generating image data by performing image capturing, and includes an optical unit 110, a solid-state image pickup device 200, and a digital signal processing (DSP) circuit 120. The imaging device 100 further includes a display unit 130, an operation unit 140, a bus 150, a frame memory 160, a storage unit 170, and a power source unit 180. The imaging device 100 may be a digital camera such as a digital still camera, for example, but is also anticipated to be a device such as a smartphone or computer equipped with imaging functions, or a vehicle-mounted camera.

The optical unit 110 collects light from a subject and guides the collected light to the solid-state image pickup device 200. The solid-state image pickup device 200 captures an image and generates image data in synchronization with a vertical synchronization signal VSYNC. Here, the vertical synchronization signal VSYNC is a periodic signal with a predetermined frequency that indicates a timing of image capturing. The solid-state image pickup device 200 supplies the image data generated by image capturing, to the DSP circuit 120 via a signal line 209.

The DSP circuit 120 executes predetermined signal processing on the image data from the solid-state image pickup device 200. The DSP circuit 120 outputs the processed image data to the frame memory 160 and the like via the bus 150.

The display unit 130 displays image data. For example, a liquid crystal panel or an organic electro luminescence (EL) panel is assumed as the display unit 130. The operation unit 140 generates an operation signal in accordance with an operation of a user.

The bus 150 is a shared route for the optical unit 110, the solid-state image pickup device 200, the DSP circuit 120, the display unit 130, the operation unit 140, the frame memory 160, the storage unit 170, and the power source unit 180 exchanging data with one another.

The frame memory 160 holds image data. The storage unit 170 stores various types of data such as image data. The power source unit 180 supplies power to the solid-state image pickup device 200, the DSP circuit 120, the display unit 130, and the like.

[Configuration Example of Solid-State Image Pickup Device]

Figure 2:
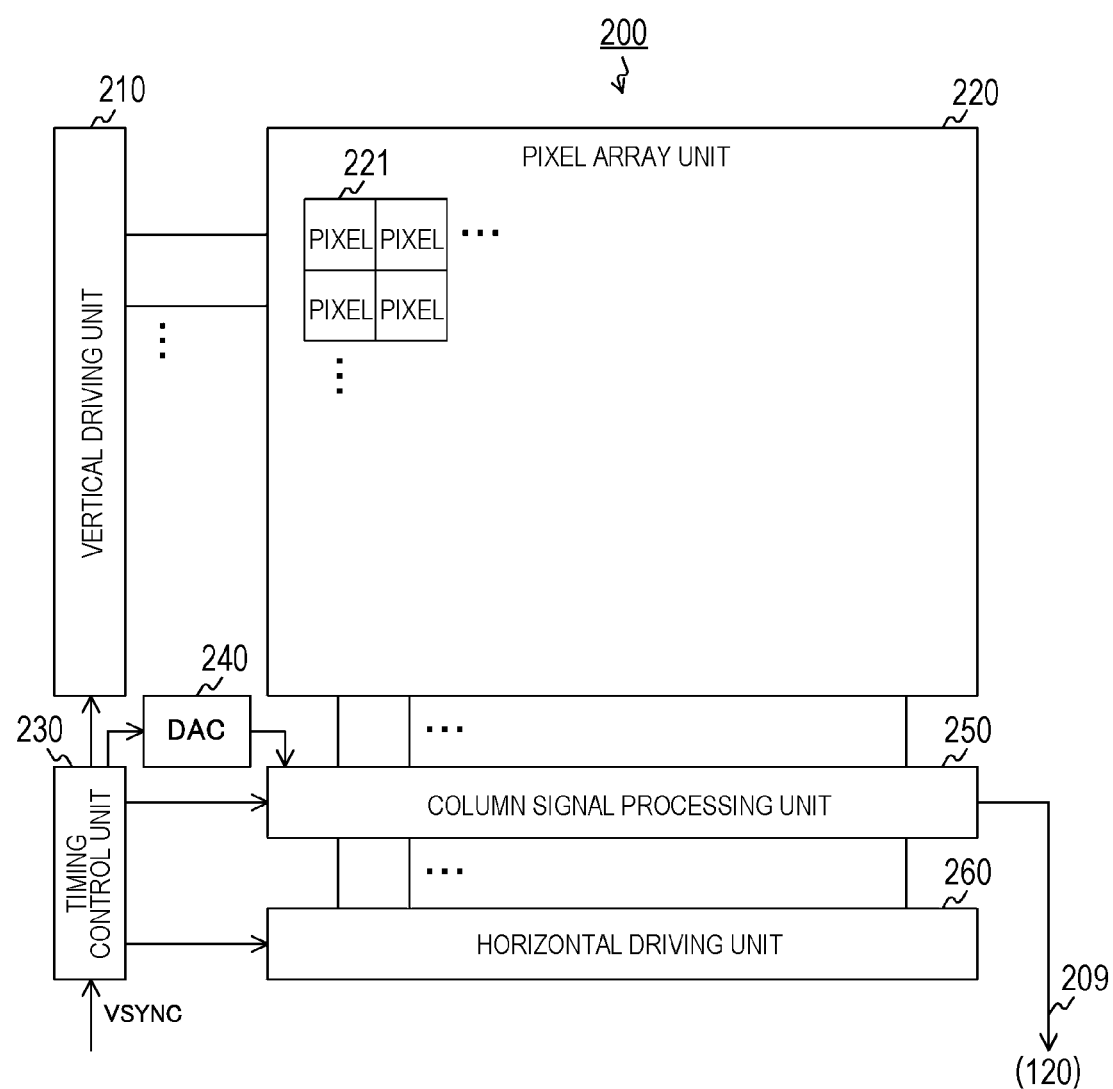
FIG. 2 is a block diagram illustrating a configuration example of a solid-state image pickup device according to the first embodiment of the present technology.

FIG. 2 is a block diagram illustrating a configuration example of a solid-state image pickup device 200 according to the first embodiment of the present technology. The solid-state image pickup device 200 includes a vertical driving unit 210, a pixel array unit 220, a timing control unit 230, a digital to analog converter (DAC) 240, a column signal processing unit 250, and a horizontal driving unit 260.

In addition, in the pixel array unit 220, a plurality of pixels 221 is arrayed in a two-dimensional lattice. Hereinafter, an aggregate of pixels 221 arrayed in a horizontal direction will be referred to as a "row", and an aggregate of pixels 221 arrayed in a direction vertical to the row will be referred to as a "column".

The pixel 221 photoelectrically converts incident light and generate an analog single-ended signal. The vertical driving unit 210 sequentially selects and drives rows and causes single-ended signals to be output.

The timing control unit 230 controls the respective operation timings of the vertical driving unit 210, the timing control unit 230, the DAC 240, the column signal processing unit 250, and the horizontal driving unit 260 in synchronization with the vertical synchronization signal VSYNC.

The DAC 240 generates a predetermined reference signal by performing digital to analog (DA) conversion of a digital signal from the timing control unit 230, and supplies the generated predetermined reference signal to the column signal processing unit 250. For example, a sawtooth ramp signal is used as the reference signal.

The column signal processing unit 250 executes predetermined signal processing such as analog to digital (AD) conversion or correlated double sampling (CDS) processing on a single-ended signal. The column signal processing unit 250 outputs a processed signal to the DSP circuit 120 as pixel data.

The horizontal driving unit 260 drives the column signal processing unit 250, and causes pixel data of each column to be sequentially output.

[Configuration Example of Pixel]

Figure 3:
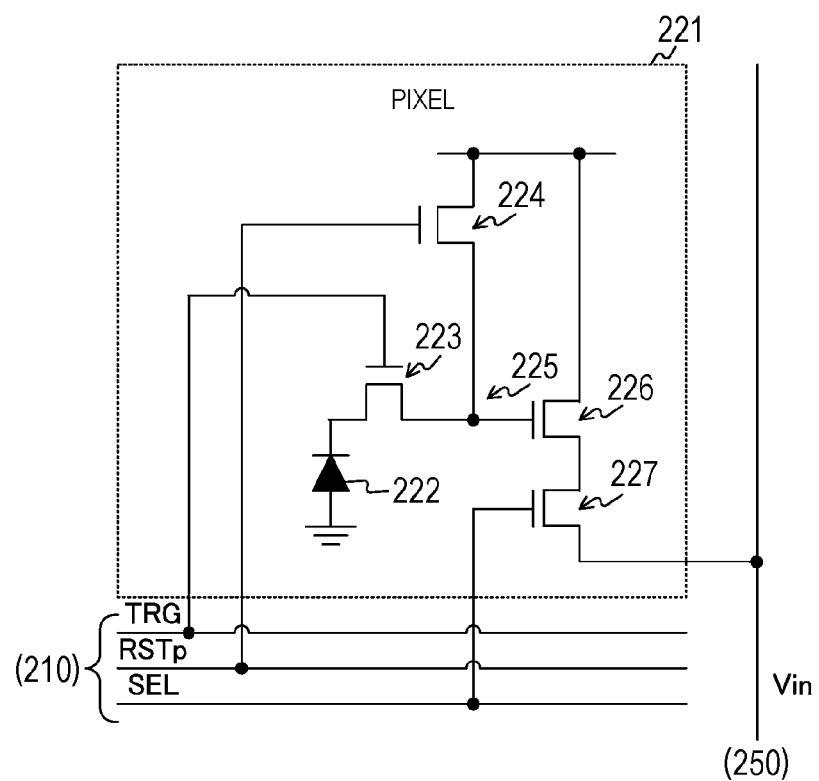
FIG. 3 is a circuit diagram illustrating a configuration example of a pixel according to the first embodiment of the present technology.

FIG. 3 is a circuit diagram illustrating a configuration example of a pixel 221 according to the first embodiment of the present technology. The pixel 221 includes a photodiode 222, a transfer transistor 223, a reset transistor 224, a floating diffusion layer 225, an amplification transistor 226, and a selection transistor 227.

The photodiode 222 photoelectrically converts incident light and generates an electric charge. The transfer transistor 223 transfers the electric charge from the photodiode 222 to the floating diffusion layer 225 in accordance with a transfer signal TRG from the vertical driving unit 210.

The reset transistor 224 extracts the electric charge from the floating diffusion layer 225 in accordance with a reset signal RSTp from the vertical driving unit 210 and initializes an electric charge amount. The floating diffusion layer 225 accumulates electric charges, and generates a voltage corresponding to an accumulated electric charge amount.

The amplification transistor 226 amplifies the voltage of the floating diffusion layer 225. The selection transistor 227 supplies a single-ended signal with the amplified voltage to the column signal processing unit 250 as an input signal Vin in accordance with a selection signal SEL from the vertical driving unit 210.

Here, a level of the input signal Vin that is obtained when the floating diffusion layer 225 is initialized will be referred to as a reset level or a P-phase level. In addition, a level of the input signal Vin that is obtained when an electric charge is transferred to the floating diffusion layer 225 will be referred to as a signal level or a D-phase level.

Note that a circuit configuration of the pixels 221 is not limited to the configuration exemplified in FIG. 3 as long as a single-ended signal can be generated by photoelectric conversion.

[Configuration Example of Column Signal Processing Unit]

Figure 4:
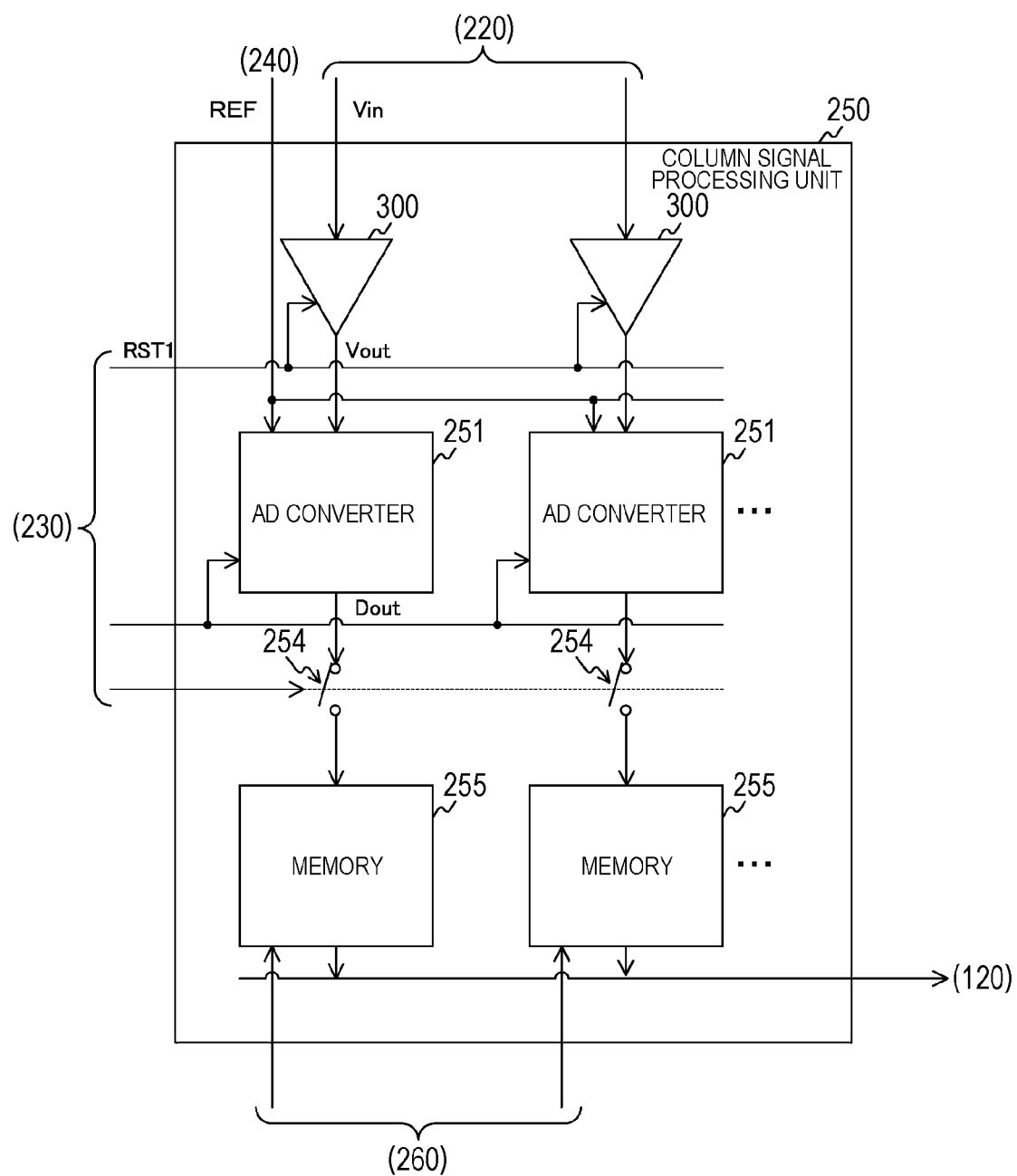
FIG. 4 is a block diagram illustrating a configuration example a column signal processing unit according to the first embodiment of the present technology.

FIG. 4 is a block diagram illustrating a configuration example a column signal processing unit 250 according to the first embodiment of the present technology. The column signal processing unit 250 includes, for each column, an amplification circuit 300, an AD converter 251, a transfer switch 254, and a memory 255. In a case where the number of columns is N (N is an integer), N amplification circuits 300, N AD converters 251, N transfer switches 254, and N memories 255 are arranged.

The amplification circuit 300 amplifies the input signal Vin (i.e., single-ended signal) and supplies the amplified input signal Vin to the AD converter 251 as an output signal Vout. In addition, in a case where a reset signal RST1 from the timing control unit 230 is input, the amplification circuit 300 initializes an electric charge of a capacitor that determines a gain for amplifying an input signal.

The AD converter 251 performs AD conversion of the output signal Vout. The AD converter 251 supplies the AD-converted data to the transfer switch 254 as pixel data Dout.

The transfer switch 254 opens and closes a route between the AD converter 251 and the memory 255 in accordance with the control of the timing control unit 230.

The memory 255 holds pixel data. The memory 255 supplies pixel data to the DSP circuit 120 in accordance with the control of the horizontal driving unit 260.

Note that, in the column signal processing unit 250, a circuit for performing CDS processing is omitted.

In addition, the amplification circuit 300 is arranged in the imaging device 100, but the amplification circuit 300 can also be arranged in an apparatus or a device (communication apparatus, acoustic device, etc.) that is other than the imaging device 100 as long as the apparatus or the device processes a single-ended signal by amplifying the single-ended signal.

[Configuration Example of Amplification Circuit]

Figure 5:
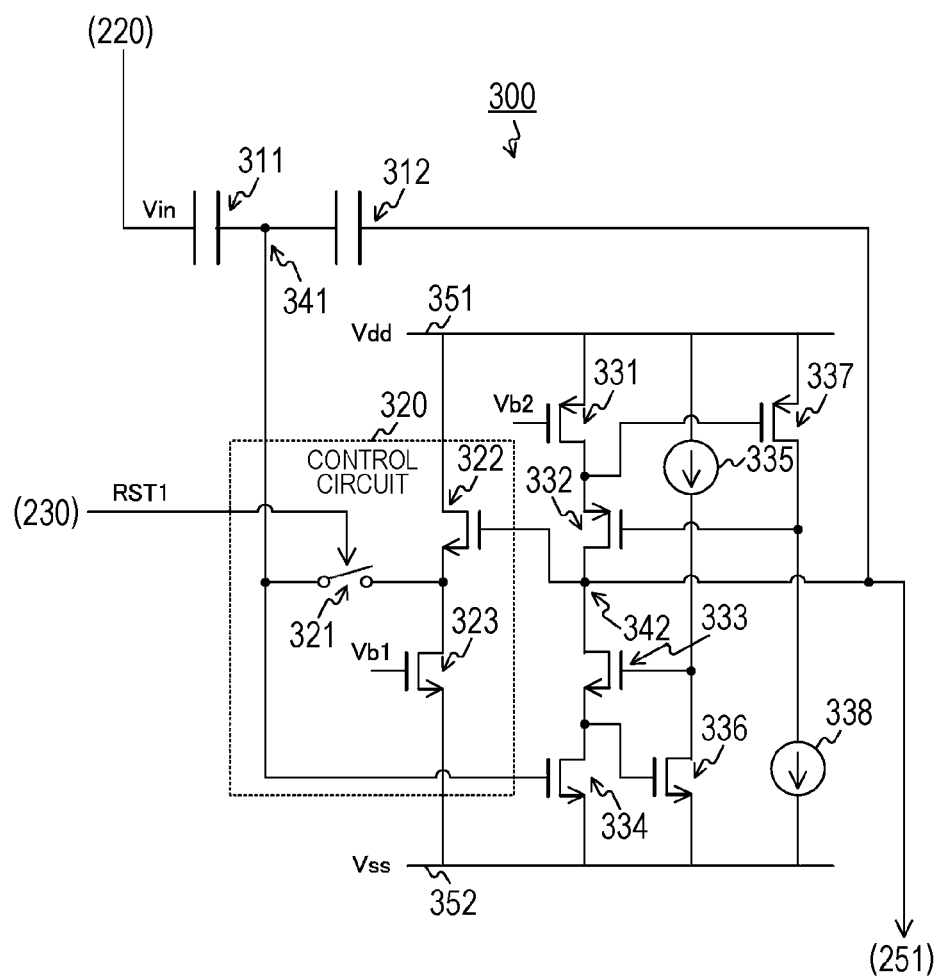
FIG. 5 is a circuit diagram illustrating a configuration example of an amplification circuit according to the first embodiment of the present technology.

FIG. 5 is a block diagram illustrating a configuration example of an amplification circuit 300 according to the first embodiment of the present technology. The amplification circuit 300 includes capacitors 311 and 312 and a control circuit 320. In addition, the amplification circuit 300 includes a current source transistor 331, cascode transistors 332 and 333, an amplification transistor 334, current sources 335 and 338, an nMOS transistor 336, and a pMOS transistor 337. In addition, the control circuit 320 includes an input side switch 321, a source follower transistor 322, and a current source transistor 323. For example, pMOS transistors are used as the current source transistor 331 and the cascode transistor 332. For example, nMOS transistors are used as the cascode transistor 333, the amplification transistor 334, the source follower transistor 322, and the current source transistor 323.

One end of the capacitor 311 is connected to the pixel array unit 220 and another end is connected to an input node 341. One end of the capacitor 312 is connected to the input node 341 and another end is connected to the AD converter 251. The input signal Vin is input to the input node 341 via the capacitor 311.

The source follower transistor 322 and the current source transistor 323 are connected in series between a power line 351 with a power potential Vdd and a reference potential line 352 with a reference potential Vss. Here, the reference potential Vss is an electric potential (grounding potential, etc.) lower than the power potential Vdd. In addition, a predetermined bias potential Vb1 is applied to a gate of the current source transistor 323.

The input side switch 321 opens and closes a route between the input node 341 and a source of the source follower transistor 322 in accordance with a reset signal RST1 from the timing control unit 230. Here, the reset signal RST1 is a signal for issuing an initialization instruction of an electric charge of a capacitor that determines a gain of the amplification circuit 300. For example, in a case where initialization is to be performed, the reset signal RST1 is set to a high level, and in other cases, the reset signal RST1 is set to a low level. In a case where an initialization instruction is issued, the input side switch 321 shifts to a closed state and connects the source of the source follower transistor 322 to the input node 341. On the other hand, in a case where an initialization instruction is not issued, the input side switch 321 shifts to an opened state and separates the source of the source follower transistor 322 from the input node 341. For example, an nMOS transistor is used as the input side switch 321.

The current source transistor 331, the cascode transistor 332, the cascode transistor 333, and the amplification transistor 334 are connected in series between the power line 351 and the reference potential line 352. In addition, the current source 335 and the nMOS transistor 336 are also connected in series between the power line 351 and the reference potential line 352. Similarly, the pMOS transistor 337 and the current source 338 are also connected in series between the power line 351 and the reference potential line 352.

In addition, a predetermined bias potential Vb2 is applied to a gate of the current source transistor 331. A gate of the cascode transistor 332 is connected to a connection point of the pMOS transistor 337 and the current source 338. A connection point of the cascode transistors 332 and 333 is used as an output node 342 for outputting the output signal Vout, and is connected to the AD converter 251 and a gate of the source follower transistor 322. A gate of the cascode transistor 333 is connected to a connection point of the current source 335 and the nMOS transistor 336. A gate of the amplification transistor 334 is connected to the input node 341.

With the above-described configuration, the amplification circuit 300 amplifies the input signal Vin and outputs the amplified input signal Vin to the AD converter 251 as the output signal Vout. In addition, in a case where an initialization instruction is issued in accordance with the reset signal RST1, the amplification circuit 300 initializes an electric charge of a capacitor that determines a gain.

Figure 6:
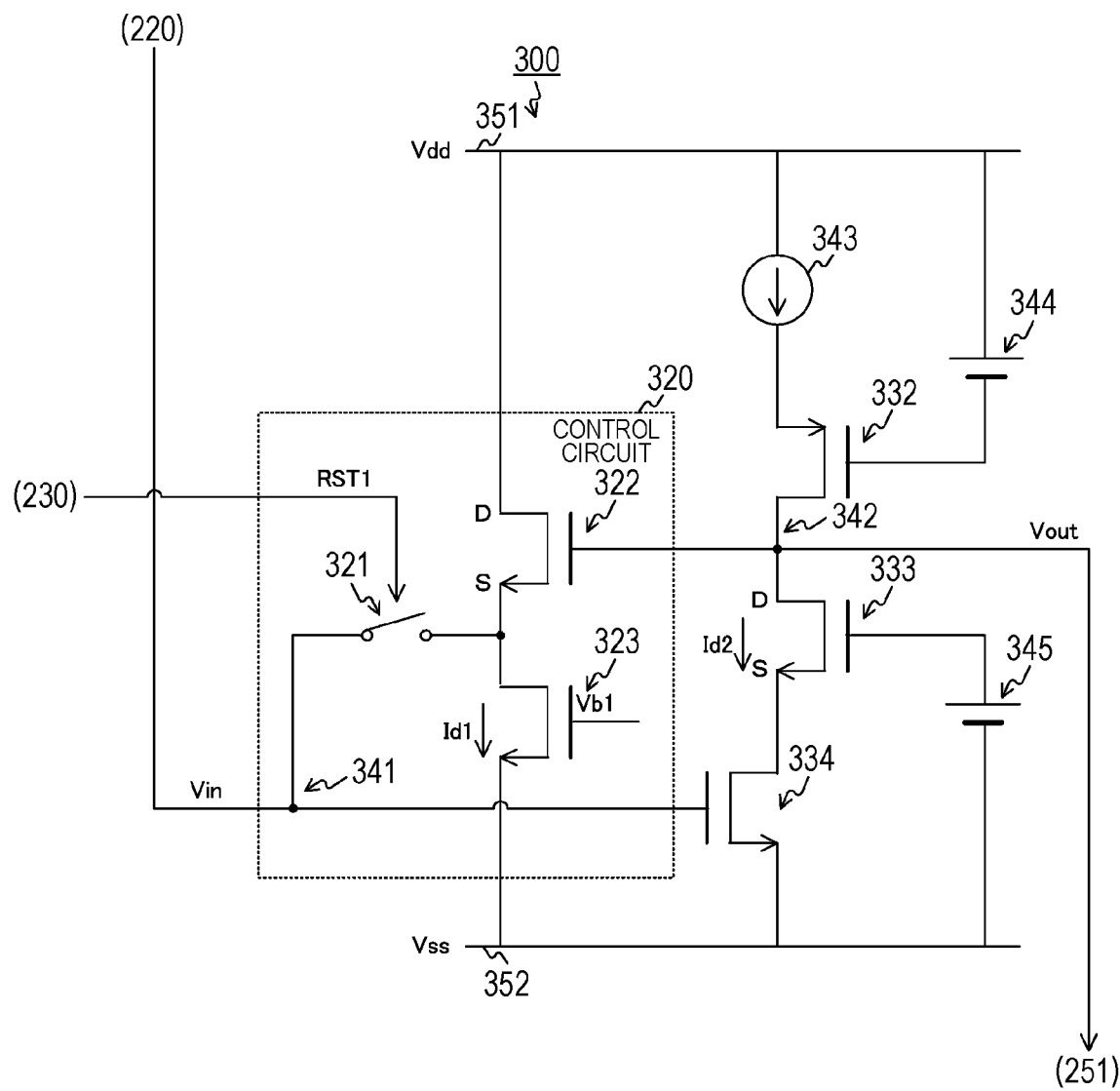
FIG. 6 is a graph illustrating an example of a characteristic in reset of the amplification circuit according to the first embodiment of the present technology.

FIG. 6 is a circuit diagram schematically illustrating an amplification circuit 300 according to the first embodiment of the present technology. In the drawing, the capacitors 311 and 312 are omitted. In addition, the current source transistor 331 is substituted with a current source 343, and the pMOS transistor 337 and the current source 338 are substituted with a bias potential supply source 344 that supplies a constant bias potential to the gate of the cascode transistor 332. The current source 335 and the nMOS transistor 336 are substituted with a bias potential supply source 345 that supplies a constant bias potential to the gate of the cascode transistor 333.

In the amplification circuit 300, the amplification transistor 334 amplifies the input signal Vin. In addition, in a case where a drain-source voltage is higher than a boundary voltage Vbo, the cascode transistor 333 generates a substantially-constant drain current Id2, and supplies the generated substantially-constant drain current Id2 to the reference potential line 352 via the amplification transistor 334. Here, the boundary voltage Vbo is a drain-source voltage at a boundary between a linear region in which a drain current linearly changes and a saturated region in which the drain current Id2 becomes substantially constant.

In addition, the cascode transistor 332 restricts the output signal Vout to an electric potential smaller than a predetermined clip potential.

The source of the source follower transistor 322 is connected to the reference potential line 352 via the current source transistor 323, and such a circuit is referred to as a source follower circuit. In the source follower circuit, the gate of the source follower transistor 322 varies in accordance with the source of the source follower transistor 322. For example, when an electric potential of the source varies, an electric potential of the gate varies to an electric potential obtained by adding a constant value to the varied electric potential of the source.

When an initialization instruction is issued and the input side switch 321 shifts to the closed state, the input signal Vin is input to the source of the source follower transistor 322. Then, an electric potential of the gate of the source follower transistor 322 (i.e., an electric potential of a drain of the cascode transistor 333) becomes higher than that of the source by a constant value, and a drain-source voltage Vds of the cascode transistor 333 becomes higher by that amount. Gate widths and gate lengths of the source follower transistor 322 and the current source transistor 323 are adjusted in such a manner that the raised drain-source voltage Vds becomes higher than the boundary voltage Vbo. For this reason, the cascode transistor 333 operates in the saturated region.

Here, a comparative example having a configuration in which one end of the input side switch 321 is directly connect to the output node 342 without providing the source follower transistor 322 and the current source transistor 323 will be assumed. In this comparative example, because the input node 341 is connected with the output node 342 in initialization, when an electric potential of the input signal Vin is low, an electric potential of the output node 342 (i.e., an electric potential of the drain of the cascode transistor 333) also becomes lower. For this reason, the drain-source voltage Vds of the cascode transistor 333 sometimes becomes equal to or smaller than the boundary voltage Vbo. At this time, the cascode transistor 333 operates in the linear region and a gain of the amplification circuit 300 varies. For this reason, even in a case where there is the same pixel signal, an error is generated between signals from the amplification circuits 300 of the respective columns, and image quality declines.

In contrast to this, in the amplification circuit 300, because the control circuit 320 controls the drain-source voltage Vds to be a value higher than the boundary voltage Vbo in initialization, the cascode transistor 333 operates in the saturated region. With this arrangement, a gain of an amplifier can be kept high in initialization, and a decline in image quality that is attributed to a variation of a gain can be suppressed.

[Configuration Example of AD Converter]

Figure 7:
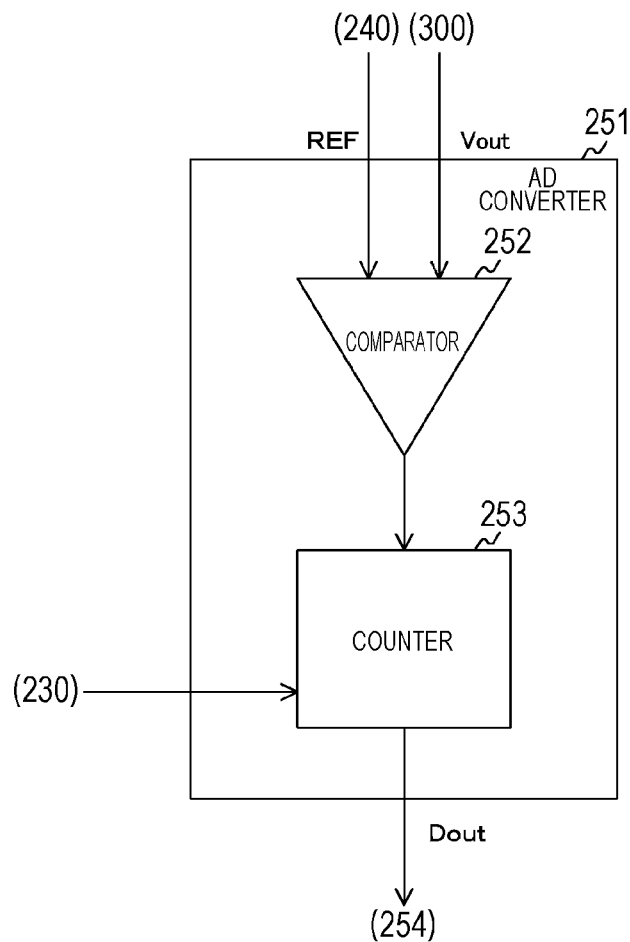
FIG. 7 is a block diagram illustrating a configuration example an analog to digital (AD) converter according to the first embodiment of the present technology.

FIG. 7 is a block diagram illustrating a configuration example an AD converter 251 according to the first embodiment of the present technology. The AD converter 251 includes a comparator 252 and a counter 253.

The comparator 252 compares the output signal Vout from the amplification circuit 300 and a reference signal REF from the DAC 240. The comparator 252 supplies a comparison result to the counter 253.

The counter 253 counts a count value on the basis of the comparison result of the comparator 252 in accordance with the control of the timing control unit 230.

The timing control unit 230 sets a count value of the counter 253 to an initial value in the initialization of the amplification circuit 300. Then, in synchronization with a clock signal with a predetermined frequency, the counter 253 counts a count value over the period until the comparison result turns over, and outputs the pixel data Dout indicating the count value. The count value indicates a reset level (P-phase level).

Subsequently, when an electric charge is transferred to the floating diffusion layer 225, the timing control unit 230 sets the count value of the counter 253 to an initial value. Then, in synchronization with the clock signal, the counter 253 counts a count value over the period until the comparison result turns over, and outputs the pixel data Dout indicating the count value. The count value indicates a signal level (D-phase level).

By CDS processing of obtaining a difference between the reset level and the signal level, reset noise generated in the pixel 221 can be removed.

[Operation Example of Solid-State Image Pickup Device]

Figure 8:
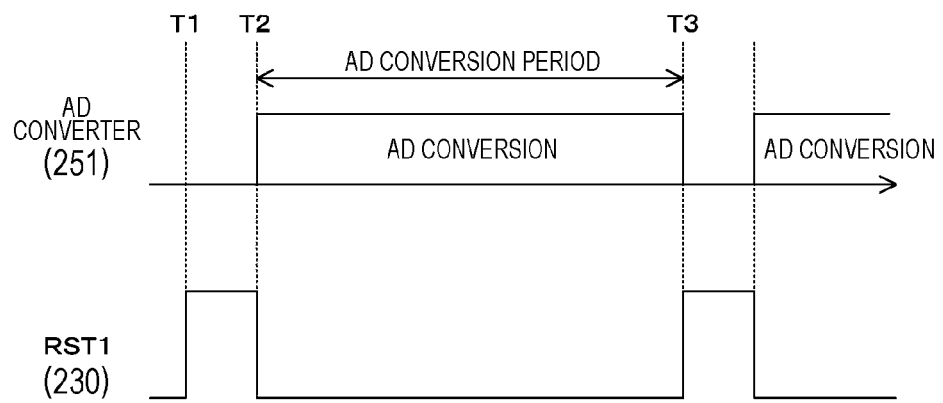
FIG. 8 is a timing chart illustrating an example of an operation of the solid-state image pickup device according to the first embodiment of the present technology.

FIG. 8 is a timing chart illustrating an example of an operation of a solid-state image pickup device 200 according to the first embodiment of the present technology. The timing control unit 230 supplies the reset signal RST1 with a high level to the amplification circuit 300 over the period from a timing T1 immediately before AD conversion to a timing T2. The amplification circuit 300 initializes an electric charge of a capacitor that determines a gain, in accordance with the reset signal RST1.

Then, the AD converter 251 sequentially performs AD conversion of the reset level and the signal level over the period from the timing T2 to a timing T3 at which an AD conversion period has elapsed.

Figure 9:
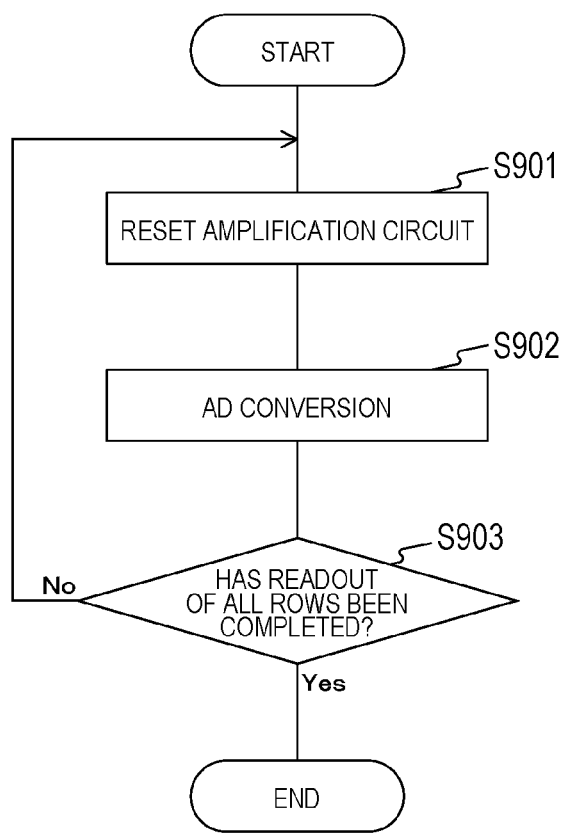
FIG. 9 is a flowchart illustrating an example of an operation of the solid-state image pickup device according to the first embodiment of the present technology.

FIG. 9 is a flowchart illustrating an example of an operation of the solid-state image pickup device 200 according to the first embodiment of the present technology. The operation is started when a predetermined application for generating image data by performing image capturing is executed, for example.

In the solid-state image pickup device 200, the timing control unit 230 initializes the amplification circuit 300 (step S901). Then, the amplification circuit 300 amplifies the input signal Vin of a row selected by the driving circuit 210, and the AD converter 251 sequentially performs AD conversion of a reset level and a signal level of the row (step S902). Pixel data of one row is thereby read out.

The solid-state image pickup device 200 determines whether or not readout of all rows has been completed (step S903). In a case where readout of all rows has not been completed (step S903: No), the solid-state image pickup device 200 repeatedly executes the processing in step S901 and subsequent steps. On the other hand, in a case where readout of all rows has been completed (step S903: Yes), the solid-state image pickup device 200 ends an operation for generating image data by performing image capturing. For consecutively generating a plurality of pieces of image data by performing image capturing, the processing in steps S901 to S903 is repeatedly executed in synchronization with the vertical synchronization signal VSYNC.

In this manner, according to the first embodiment of the present technology, in a case where an initialization instruction is issued, the control circuit 320 sets a drain-source voltage of the cascode transistor 333 to be higher than a boundary voltage. A gain can be therefore kept high in initialization. With this arrangement, a decline in image quality that is attributed to a variation of a gain can be suppressed.

2. Second Embodiment

In the above-described first embodiment, the gate of the source follower transistor 322 is always connected to the output node 342. Nevertheless, in this configuration, a drain-source voltage of the current source transistor 323 varies and a drain current Id1 of the transistor varies in accordance with a variation of the output signal Vout within an AD conversion period. Then, by a variation of the drain current Id1 of each column, ground noise is generated within an AD conversion period after the initialization. An amplification circuit 300 according to the second embodiment differs from that according to the first embodiment in that the gate of the source follower transistor 322 is separated from the output node 342 within an AD conversion period after the initialization.

Figure 10:
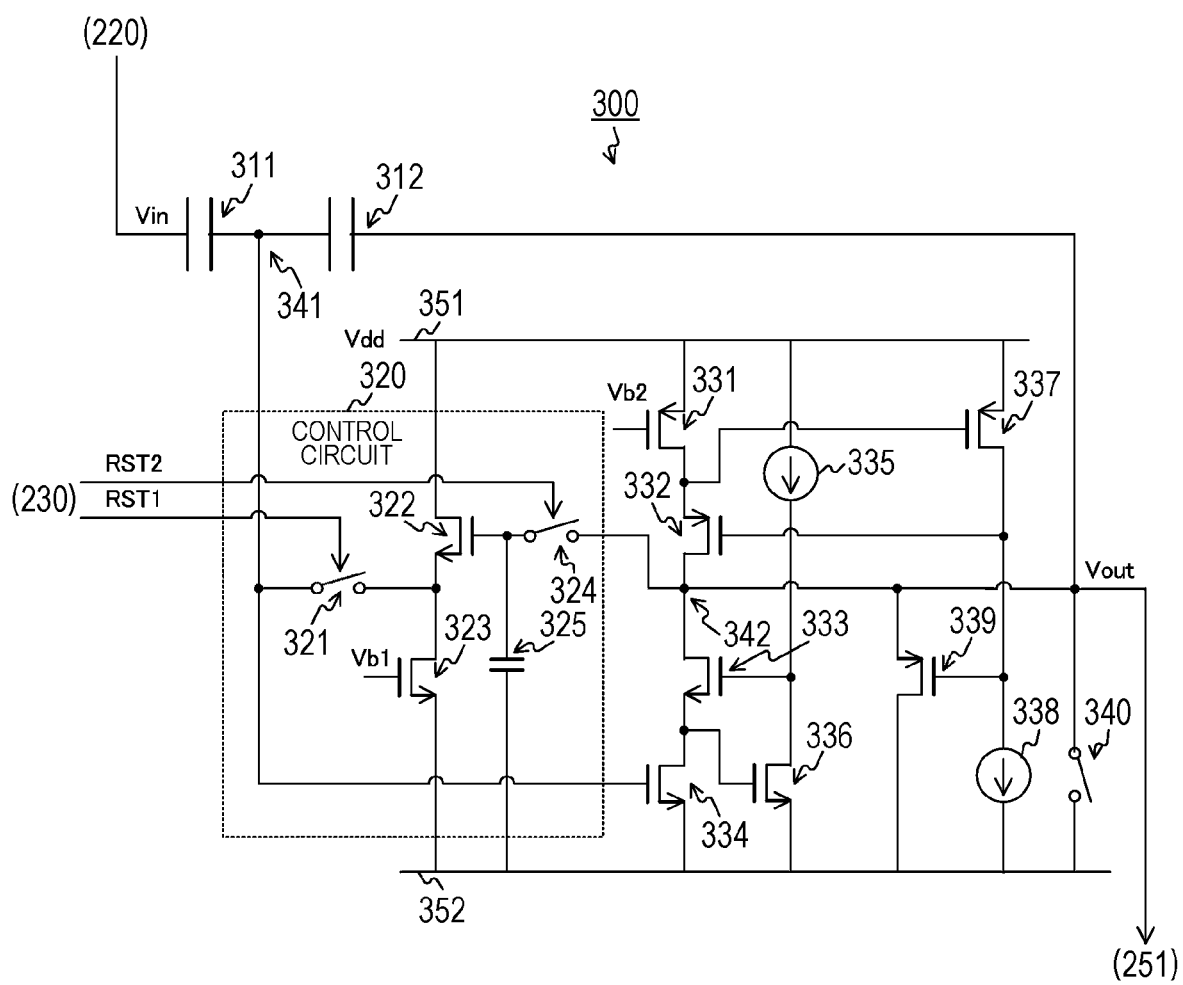
FIG. 10 is a circuit diagram illustrating a configuration example of an amplification circuit according to a second embodiment of the present technology.

FIG. 10 is a circuit diagram illustrating a configuration example of an amplification circuit 300 according to a second embodiment of the present technology. The amplification circuit 300 differs from that according to the first embodiment in that an output side switch 324, a capacitor 325, a pMOS transistor 339, and an enable switch 340 are further included. For example, an nMOS transistor is used as the output side switch 324.

The output side switch 324 opens and closes a route between the gate of the source follower transistor 322 and the output node 342 in accordance with a reset signal RST2 from the timing control unit 230. Here, the reset signal RST2 is a signal for issuing an initialization instruction. For example, in a case where initialization is to be performed, the reset signal RST2 is set to a high level, and in other cases, the reset signal RST2 is set to a low level. In a case where an initialization instruction is issued, the output side switch 324 shifts to the closed state and connects the gate of the source follower transistor 322 to the output node 342. On the other hand, in a case where an initialization is not issued, the output side switch 324 shifts to the opened state and separates the gate of the source follower transistor 322 from the output node 342. Note that the input side switch 321 and the output side switch 324 are controlled at different timings.

One end of the capacitor 325 is connected to the gate of the source follower transistor 322 and another end is connected to the reference potential line 352. A gate of the pMOS transistor 339 is connected to a connection point of the pMOS transistor 337 and the current source 338, a source is connected to the reference potential line 352, and a drain is connected to the output node 342. The enable switch 340 opens and closes a route between the output node 342 and the reference potential line 352 in accordance with an output enable signal from the timing control unit 230.

Figure 11:
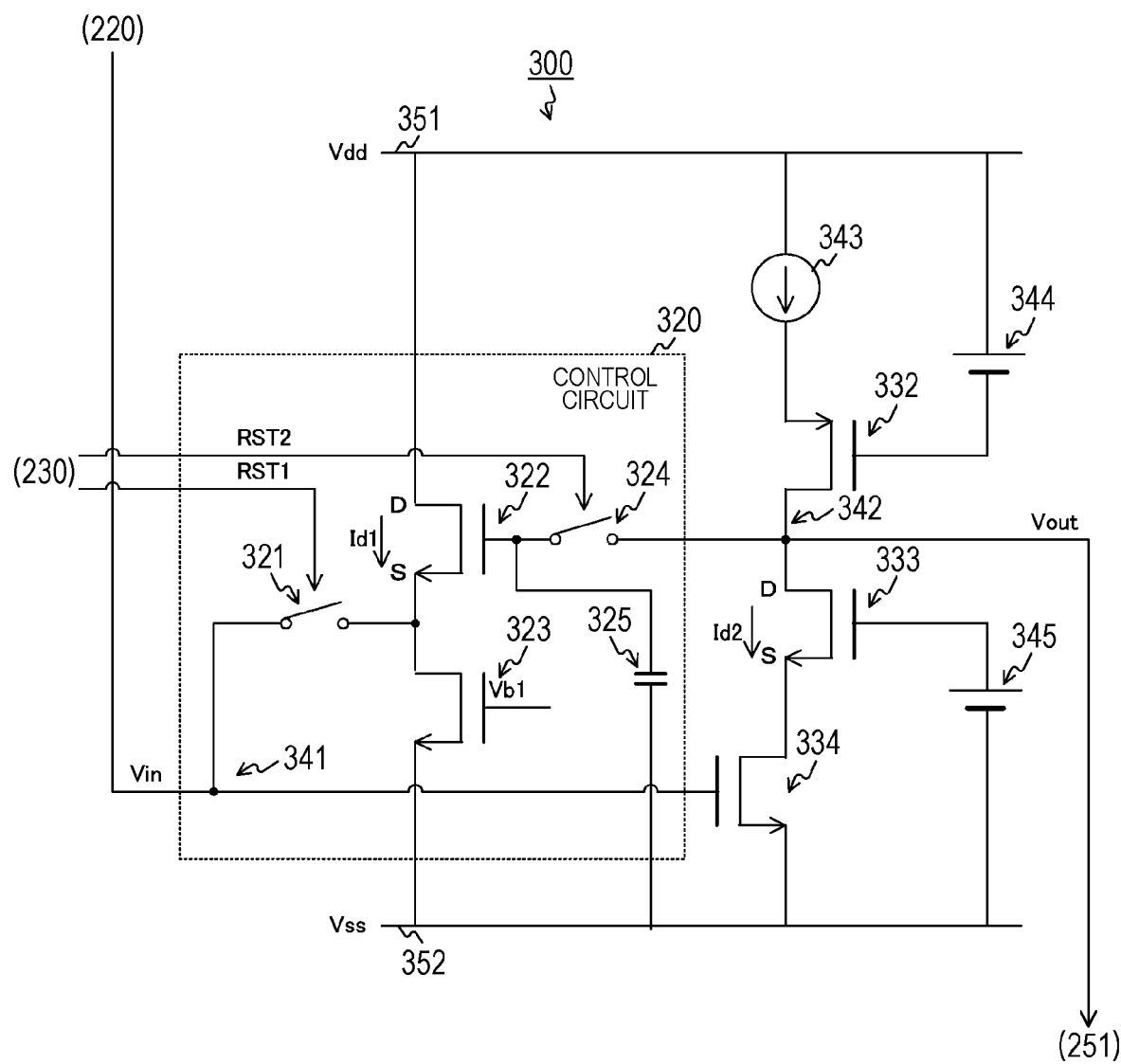
FIG. 11 is a circuit diagram schematically illustrating the amplification circuit according to the second embodiment of the present technology.

FIG. 11 is a circuit diagram schematically illustrating an amplification circuit 300 according to the second embodiment of the present technology. Similarly to the first embodiment, in the drawing, the capacitors 311 and 312, and the pMOS transistor 339 and the enable switch 340 are omitted.

Figure 12:
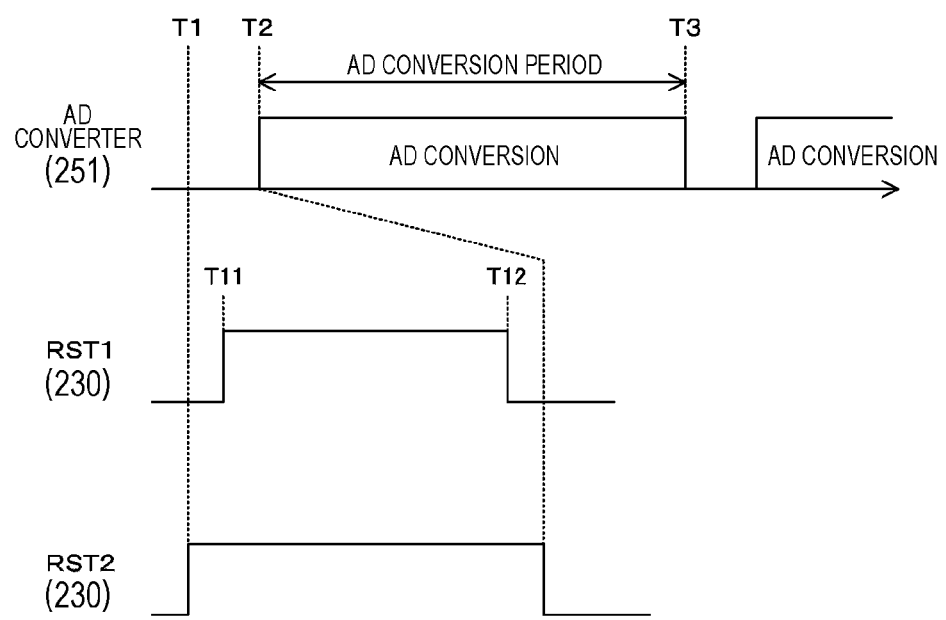
FIG. 12 is a timing chart illustrating an example of an operation of a solid-state image pickup device according to the second embodiment of the present technology.

FIG. 12 is a timing chart illustrating an example of an operation of a solid-state image pickup device 200 according to the second embodiment of the present technology. The timing control unit 230 supplies the reset signal RST2 with a high level to the output side switch 324 over the period from a timing T1 immediately before AD conversion to a timing T2. In addition, the timing control unit 230 supplies the reset signal RST1 with a high level to the input side switch 321 over the period from a timing T11 immediately after the timing T1 to a timing T12 immediately before the timing T2. For this reason, during the AD conversion, that is to say, during an amplification operation of the amplification circuit 300, both of the input side switch 321 and the output side switch 324 are in the opened state.

As described above, the respective timings at which the input side switch 321 and the output side switch 324 shift to the closed state are different, and the respective timings at which theses switches shift to the opened state are also different. For this reason, as compared with a case where theses switches open and close at the same time, kTC noise generated in switching can be reduced. Slight kTC noise is generated when the output side switch 324 shifts to the opened state, but the kTC noise does not lead to a big problem because the kTC noise can be reduced by CDS processing.

Figure 13:
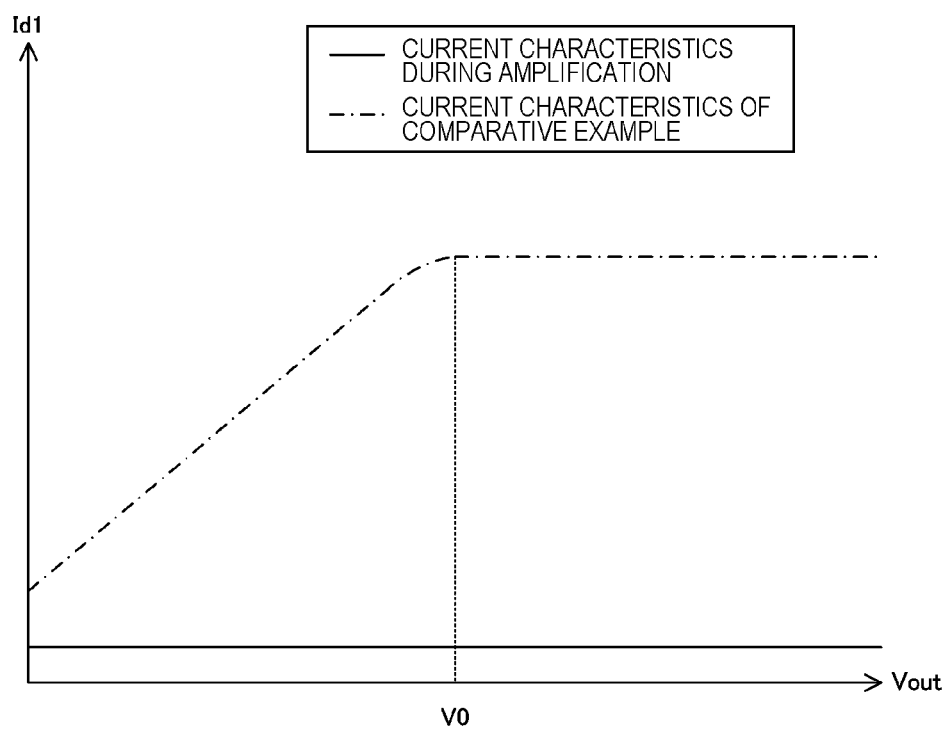
FIG. 13 is a graph illustrating a characteristic in an amplification operation of the amplification circuit according to the second embodiment of the present technology.

FIG. 13 is a graph illustrating a characteristic in an amplification operation of the amplification circuit 300 according to the second embodiment of the present technology. A vertical axis in the drawing indicates a drain current Id1 in an amplification operation, and a horizontal axis indicates an output voltage Vout. A solid line in the drawing indicates a characteristic of the drain current Id1 in a case where the output side switch 324 is provided, and a dotted line indicates a characteristic in a comparative example in which the output side switch 324 is not provided.

In the comparative example in which the output side switch 324 is not provided, when the amplification transistor 334 operates in a linear region, an electric potential of the output node 342 (the gate of the source follower transistor 322) varies in accordance with the input signal Vin. By the variation of the electric potential, a drain-source voltage of the current source transistor 323 changes in accordance with an output, and the drain current Id1 of the current source transistor 323 varies. With this arrangement, a column current being a sum of the drain currents Id1 accordingly varies. For example, the column current declines.

In contrast to this, in the amplification circuit 300, in an amplification operation of the amplification circuit 300 (i.e., within an AD conversion period), the output side switch 324 shifts to the opened state and separates the gate of the source follower transistor 322 from the output node 342. An electric potential of the output node 342 in initialization is held in the capacitor 325, and an electric potential of the gate of the source follower transistor 322 is kept constant in the amplification operation. For this reason, even if an electric potential of the output node 342 varies, a column current does not vary. With this arrangement, ground noise attributed to a variation of a column current can be reduced.

In this manner, according to the second embodiment of the present technology, because the output side switch 324 separates the gate of the source follower transistor 322 from the output node within an AD conversion period, a variation of a drain-source voltage of the current source transistor 323 can be suppressed. With this arrangement, a variation of the drain current Id1 that is caused in accordance with the drain-source voltage can be suppressed, and ground noise attributed to the variation of the drain current Id1 can be reduced.

3. Third Embodiment

In the above-described second embodiment, in an amplification operation of the amplification circuit 300 (within an AD conversion period), the output side switch 324 separates the gate of the source follower transistor 322 from the output node 342. Nevertheless, when an electric potential of the separated gate varies due to discharge of the capacitor 325, there is a possibility that the drain current Id1 varies in accordance with the variation of the electric potential. An amplification circuit 300 according to the third embodiment differs from that according to the second embodiment in that a constant bias potential is supplied to the gate of the source follower transistor 322 within an AD conversion period.

Figure 14:
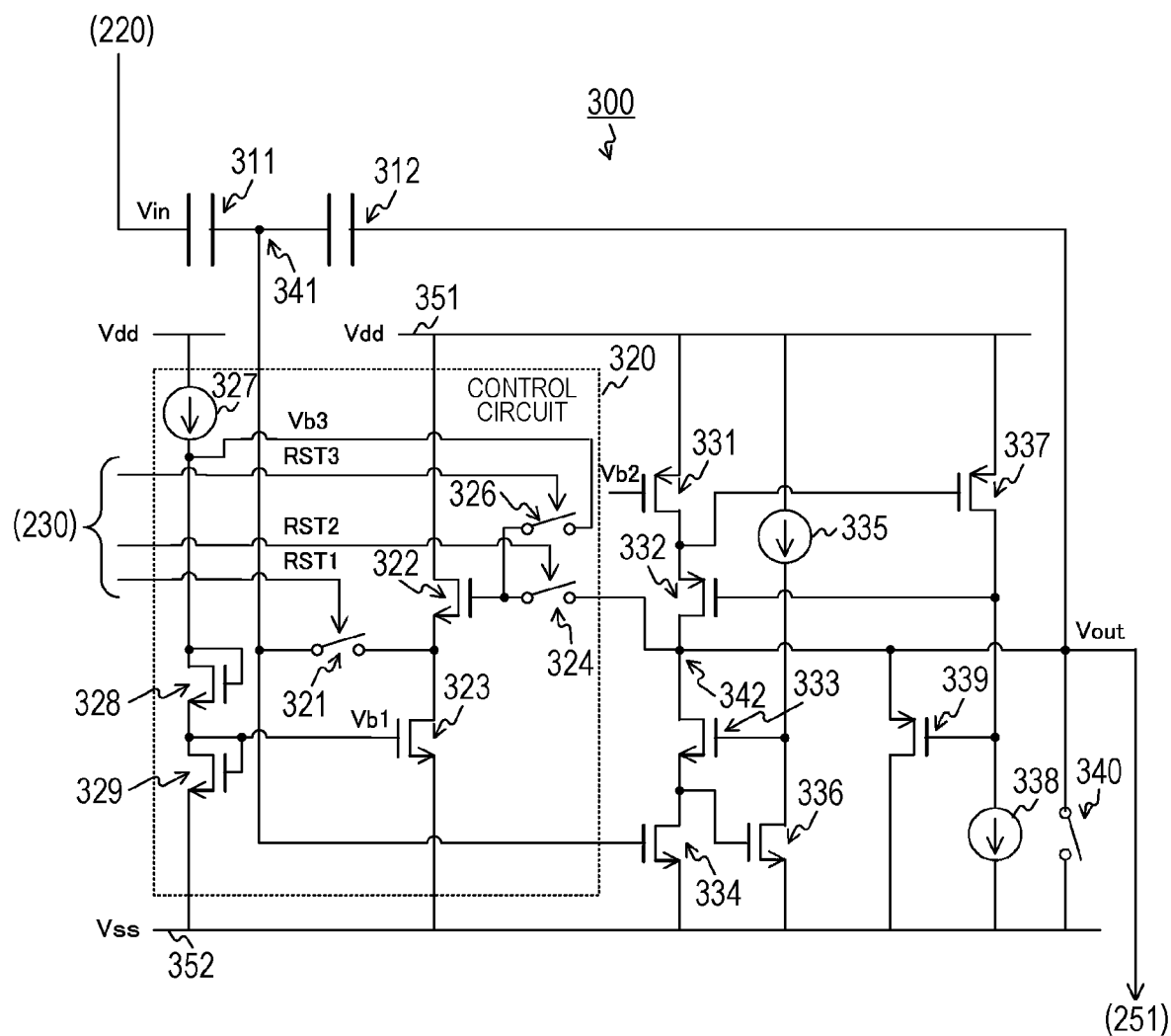
FIG. 14 is a circuit diagram illustrating a configuration example of an amplification circuit according to a third embodiment of the present technology.

FIG. 14 is a circuit diagram illustrating a configuration example of an amplification circuit 300 according to a third embodiment of the present technology. The amplification circuit 300 according to the third embodiment differs from that according to the second embodiment in that the capacitor 325 is not included in the control circuit 320, and a bias control switch 326, a current source 327, and nMOS transistors 328 and 329 are further included in the control circuit 320. For example, an nMOS transistor is used as the bias control switch 326.

The current source 327, the nMOS transistor 328, and the nMOS transistor 329 are connected in series between the power line 351 and the reference potential line 352. In addition, the respective gates and drains of the nMOS transistor 328 and the nMOS transistor 329 are short-circuited. In addition, an electric potential of a connection point of the nMOS transistors 328 and 329 is applied to the gate of the current source transistor 323 as a bias potential Vb1.

The bias control switch 326 opens and closes a route between the gate of the source follower transistor 322 and a connection point of the current source 327 and the nMOS transistor 328 in accordance with a reset signal RST3 from the timing control unit 230. Here, the reset signal RST3 is a signal for issuing a supply instruction of a constant bias potential when initialization is not to be performed. For example, in a case where a bias potential is to be supplied, the reset signal RST3 is set to a high level, and in other cases, the reset signal RST3 is set to a low level.

In a case where an instruction for not performing initialization (i.e., for supplying a bias potential) is issued, the bias control switch 326 shifts to the closed state and connects a supply source of a bias potential to the gate of the source follower transistor 322. On the other hand, in a case where a supply instruction of a bias potential is not issued, the bias control switch 326 shifts to the opened state and separates the gate of the source follower transistor 322 from the supply source of a bias potential.

Figure 15:
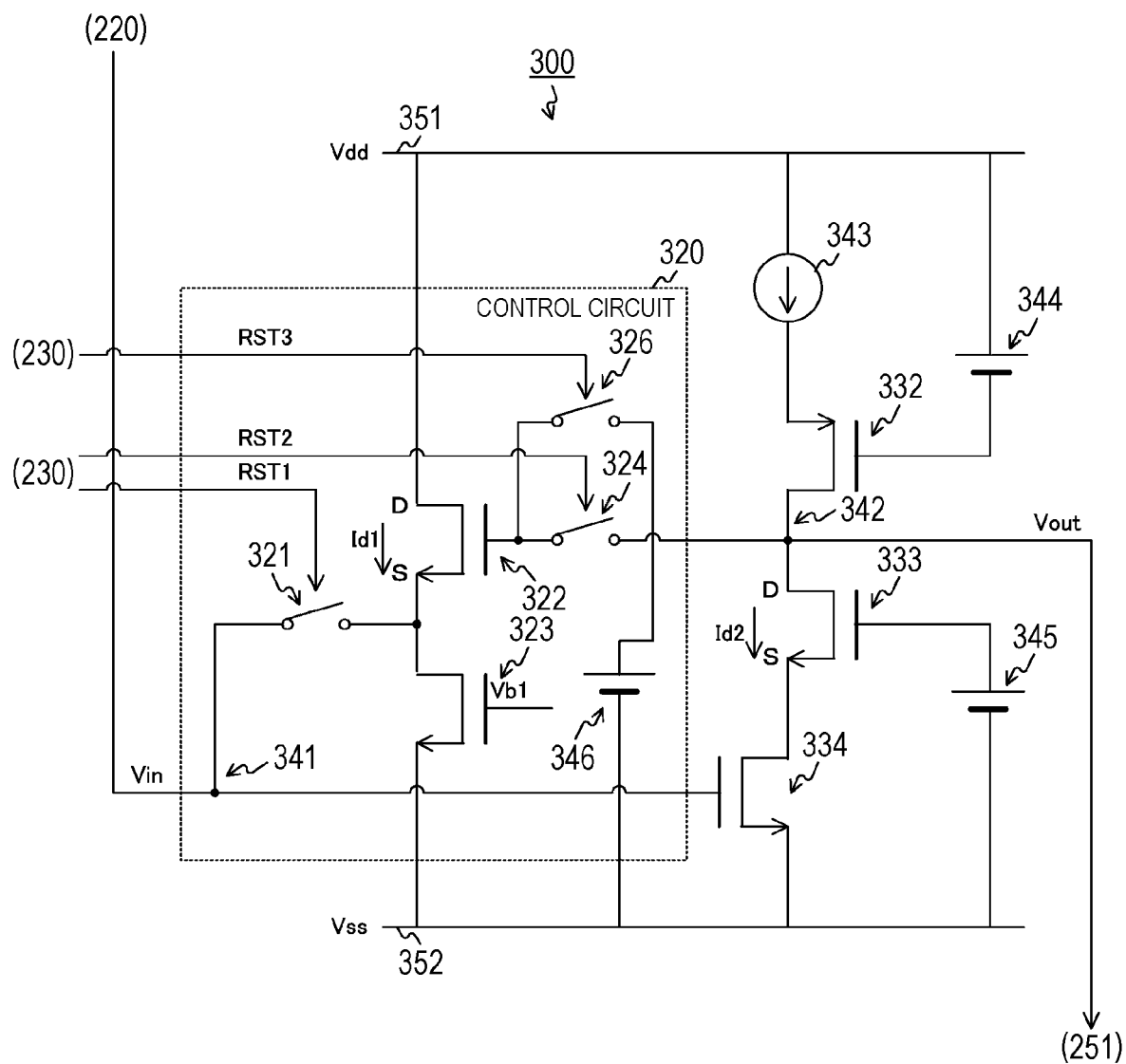
FIG. 15 is a circuit diagram schematically illustrating the amplification circuit according to the third embodiment of the present technology.

FIG. 15 is a circuit diagram schematically illustrating an amplification circuit 300 according to the third embodiment of the present technology. In the drawing, a circuit including the current source 327, the nMOS transistor 328, and the nMOS transistor 329 is substituted with a bias potential supply source 346 that supplies an electric potential of a connection point of the current source 327 and the nMOS transistor 328 as a bias potential.

Figure 16:
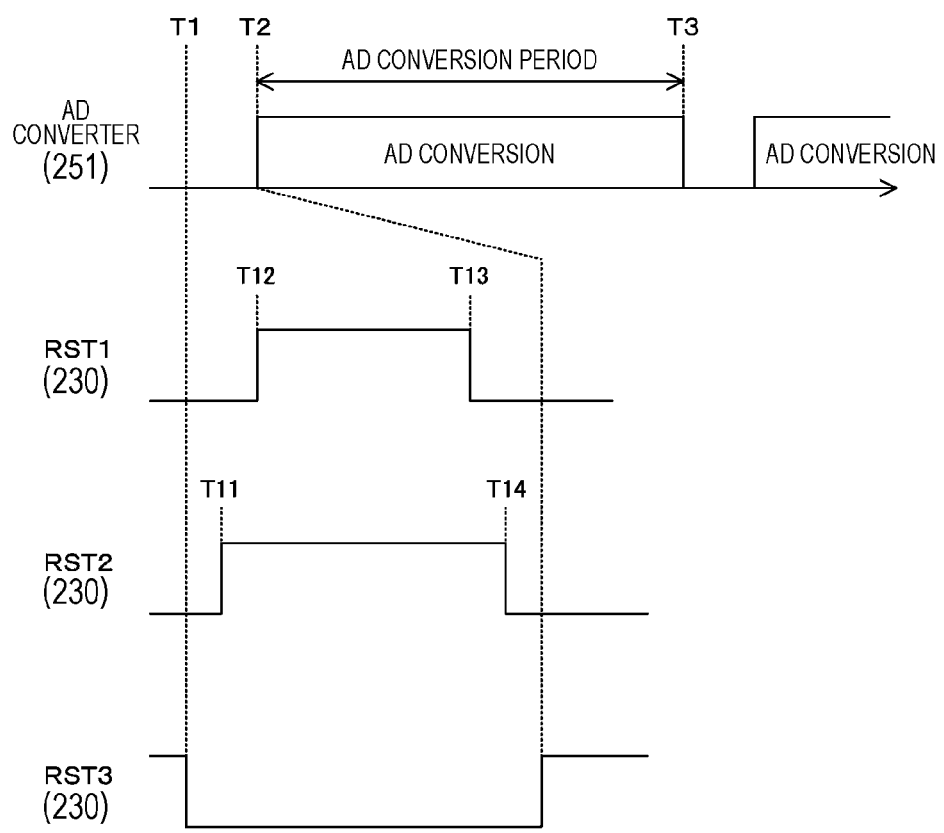
FIG. 16 is a timing chart illustrating an example of an operation of a solid-state image pickup device according to the third embodiment of the present technology.

FIG. 16 is a timing chart illustrating an example of an operation of a solid-state image pickup device 200 according to the first embodiment of the present technology. The timing control unit 230 supplies the reset signal RST3 with a low level to the bias control switch 326 over the period from a timing T1 immediately before AD conversion to a timing T2. In addition, in an AD conversion period before the timing T1 or after the timing T2, the timing control unit 230 supplies the reset signal RST3 with a high level to the bias control switch 326.

In addition, the timing control unit 230 supplies the reset signal RST2 with a high level to the output side switch 324 over the period from a timing T11 immediately after the timing T1 to a timing T14 immediately before the timing T2. In addition, the timing control unit 230 supplies the reset signal RST1 with a high level to the input side switch 321 over the period from a timing T12 immediately after the timing T11 to a timing T13 immediately before the timing T14.

As described above, the respective timings at which the input side switch 321, the output side switch 324, and the bias control switch 326 shift to the closed state are different, and the respective timings at which these switches shift to the opened state are also different. For this reason, as compared with a case where theses switches open and close at the same time, kTC noise can be reduced.

Figure 17:
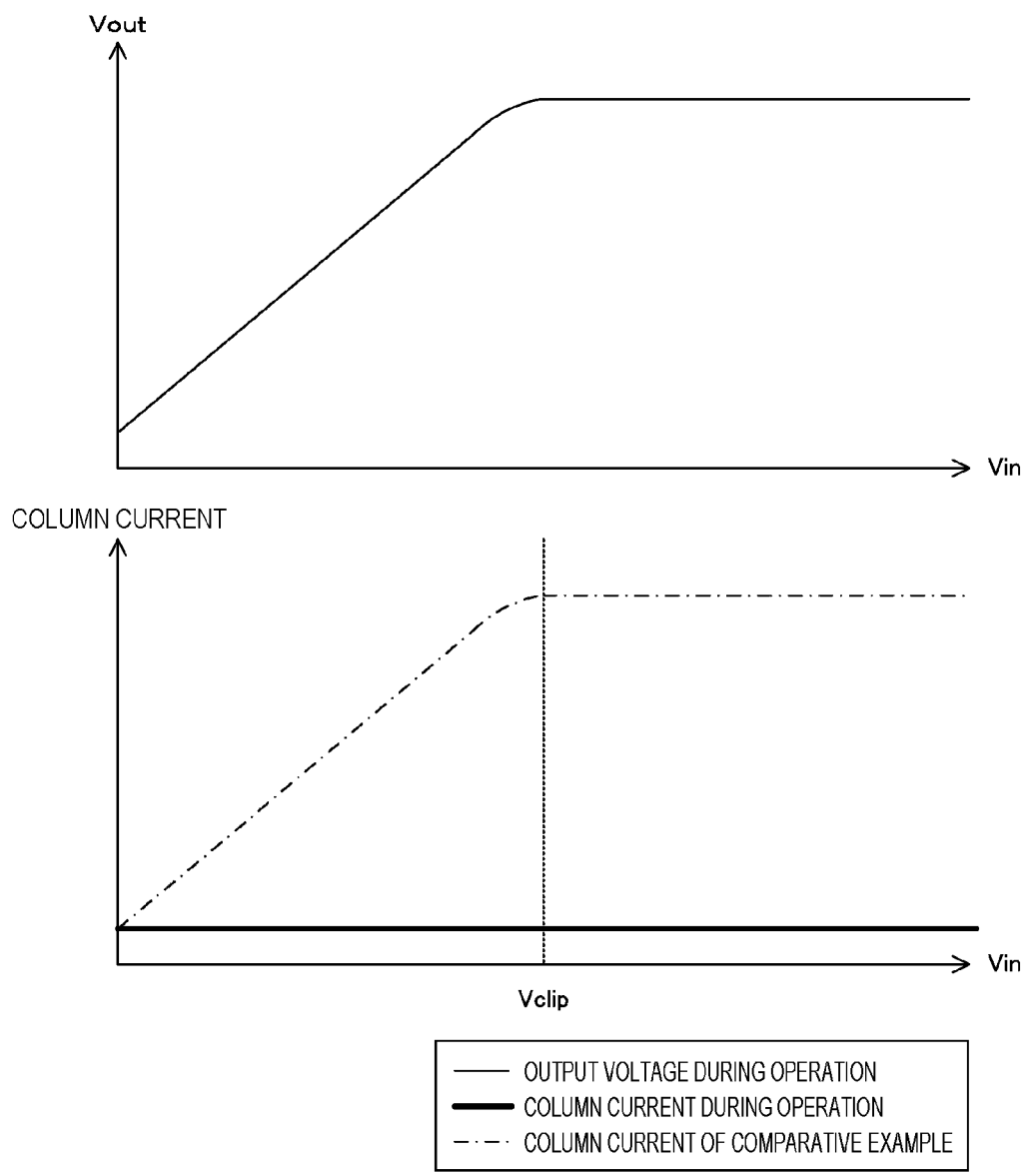
FIG. 17 is a graph illustrating a characteristic in the amplification operation of the amplification circuit according to the third embodiment of the present technology.

FIG. 17 is a graph illustrating a characteristic in an amplification operation of the amplification circuit according to the third embodiment of the present technology. A vertical axis in the drawing indicates a level of the output signal Vout or a level of a column current being a sum of the drain currents Id1 of the respective columns. A horizontal axis in the drawing indicates a level of the input signal Vin. A fine solid line in the drawing indicates a track of the output voltage Vout and a thick solid line indicates a track of a column current. In addition, a dashed-dotted line in the drawing indicates a track of a column current of the comparative example in which the bias control switch 326 is not provided.

In the comparative example in which the bias control switch 326 is not provided, the drain current Id1 in the control circuit 320 varies due to discharge of the capacitor 325. With this arrangement, a column current being a sum of the drain currents Id1 accordingly varies. For example, the column current declines.

In contrast to this, in the amplification circuit 300, in an amplification operation of the amplification circuit 300 (i.e., within an AD conversion period), by shifting the bias control switch 326 to the closed state, a constant bias potential can be supplied to the gate of the source follower transistor 322. For this reason, the column current does not vary. With this arrangement, ground noise attributed to a variation of a column current can be reduced.

Figure 18:
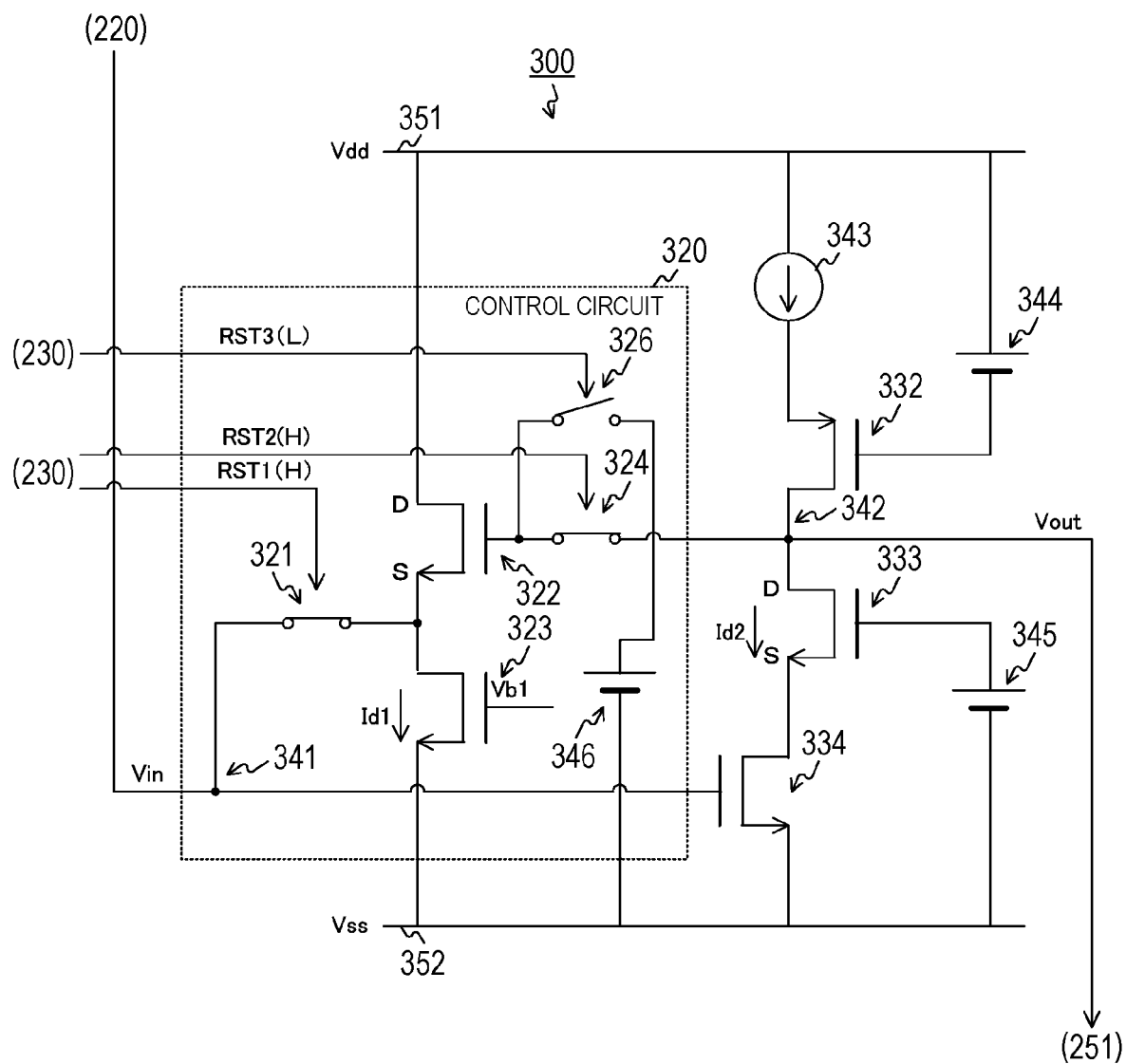
FIG. 18 is a diagram illustrating an example of a state of the amplification circuit in reset according to the third embodiment of the present technology.

FIG. 18 is a diagram illustrating an example of a state of an amplification circuit 300 in reset according to the third embodiment of the present technology. The timing control unit 230 controls the input side switch 321 and the output side switch 324 to shift to the closed state in accordance with the reset signals RST1 and RST2, and controls the bias control switch 326 to shift to the opened state in accordance with the reset signal RST3. Because the gate-source voltage Vds of the cascode transistor 333 accordingly becomes higher than the boundary voltage Vbo, a high gain can be kept, the initialization of an electric charge of a capacitor can be performed nearly-completely, and an error between column amplifiers can be suppressed.

Figure 19:
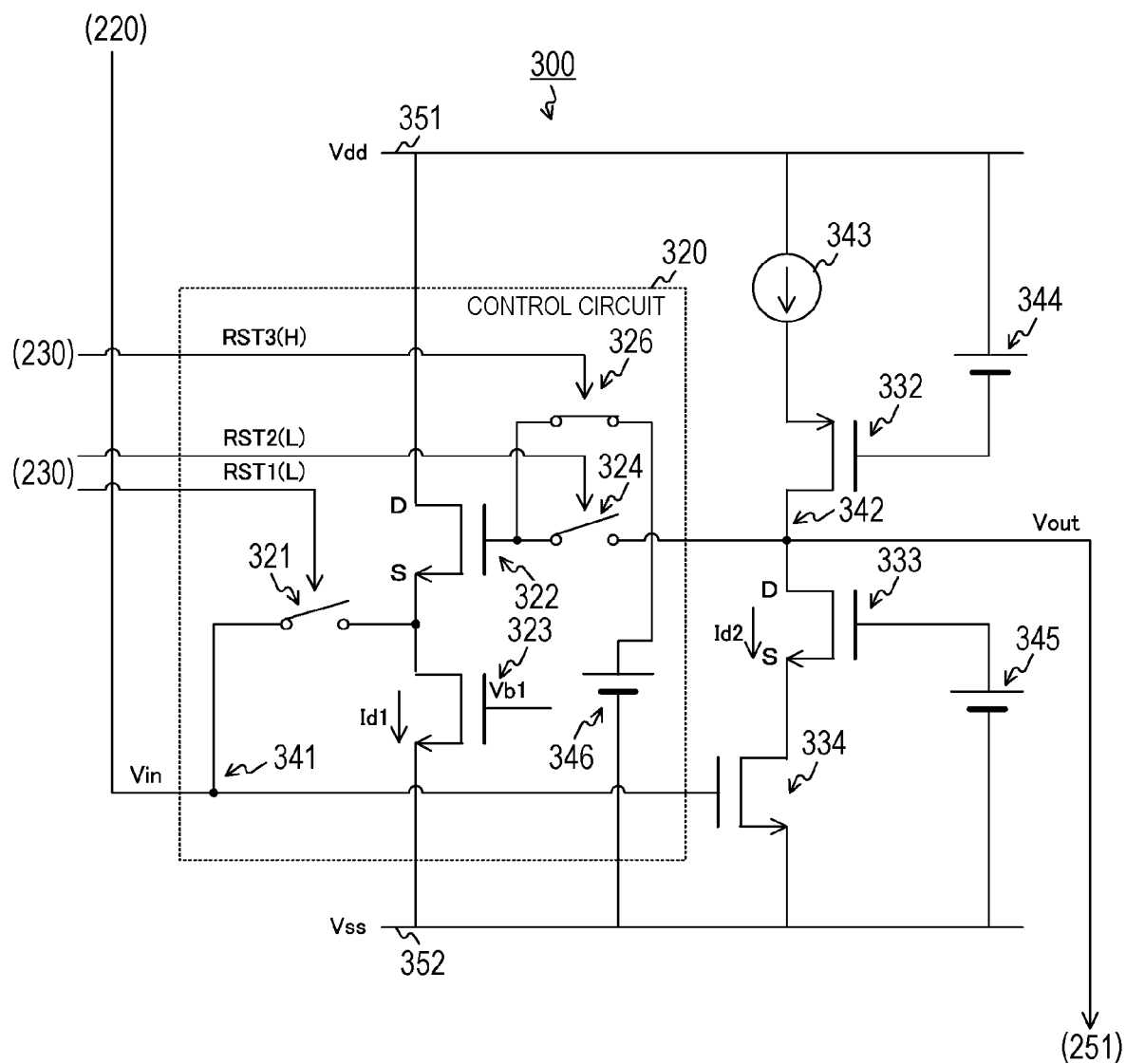
FIG. 19 is a diagram illustrating an example of a state of the amplification circuit in an amplification operation according to the third embodiment of the present technology.

FIG. 19 is a diagram illustrating an example of a state of an amplification circuit 300 in an amplification operation (during the AD conversion) according to the third embodiment of the present technology. The timing control unit 230 controls the input side switch 321 and the output side switch 324 to shift to the opened state in accordance with the reset signals RST1 and RST2, and controls the bias control switch 326 to shift to the closed state in accordance with the reset signal RST3. By shifting the output side switch 324 to the opened state, a variation of the drain current Id1 that is caused by a variation of an electric potential of the output node 342 can be suppressed. In addition, by shifting the bias control switch 326 to the closed state, a constant bias potential can be supplied to the gate of the source follower transistor 322. With this arrangement, a variation of the drain current Id1 in the control circuit 320 can be suppressed.

For verifying an effect with a suppressed current variation, simulation was performed in a 55-nanometer (nm) process. In the simulation, in a state in which an amplitude of the output signal Vout is amplified within a range in which a dynamic range becomes the maximum, a current variation value of the amplification circuit 300 of one column was obtained.

In the comparative example in which one end of the input side switch 321 is directly connected to the output node 342, a current variation value is about 750 nano-amperes (nA). In contrast to this, in the amplification circuit 300, a current variation value is about 73 pico-amperes (pA), which is smaller by four digits.

In addition, a current variation value at which streaking with 1 least significant bit (LSB) is generated was calculated by simulation. In this simulation, a value obtained by multiplying a gain of the pixels 221 on one column by a gain of the amplification circuit 300 was 30 decibels (dB), the total number of columns was 4000, and an interconnection resistance of a reference potential line was 1 ohm (Ω). Under the condition, a current variation value of one column becomes 1.6 nano-amperes (nA). As seen from this value, while streaking was 460 LSBs in the comparative example, streaking becomes 0.1 LSBs in the amplification circuit 300, and streaking has been drastically suppressed. Note that, if a current variation amount obtained when the output signal Vout is restricted is considered, streaking becomes 1 LSB.

In this manner, according to the third embodiment of the present technology, because the bias control switch 326 supplies a constant bias potential to the gate of the source follower transistor 322 within an AD conversion period, a drain-source voltage of the current source transistor 323 can be made constant. The drain current Id1 in the control circuit 320 can be thereby made constant. With this arrangement, ground noise attributed to a variation of the drain current Id1 can be reduced.

4. Application Example to Mobile Object

A technology (present technology) according to the present disclosure can be applied to various products. For example, the technology according to the present disclosure may also be realized as a device mounted in a mobile object of any type such as automobile, electric vehicle, hybrid electric vehicle, motorcycle, bicycle, personal mobility, airplane, drone, ship, or robot.

Figure 20:
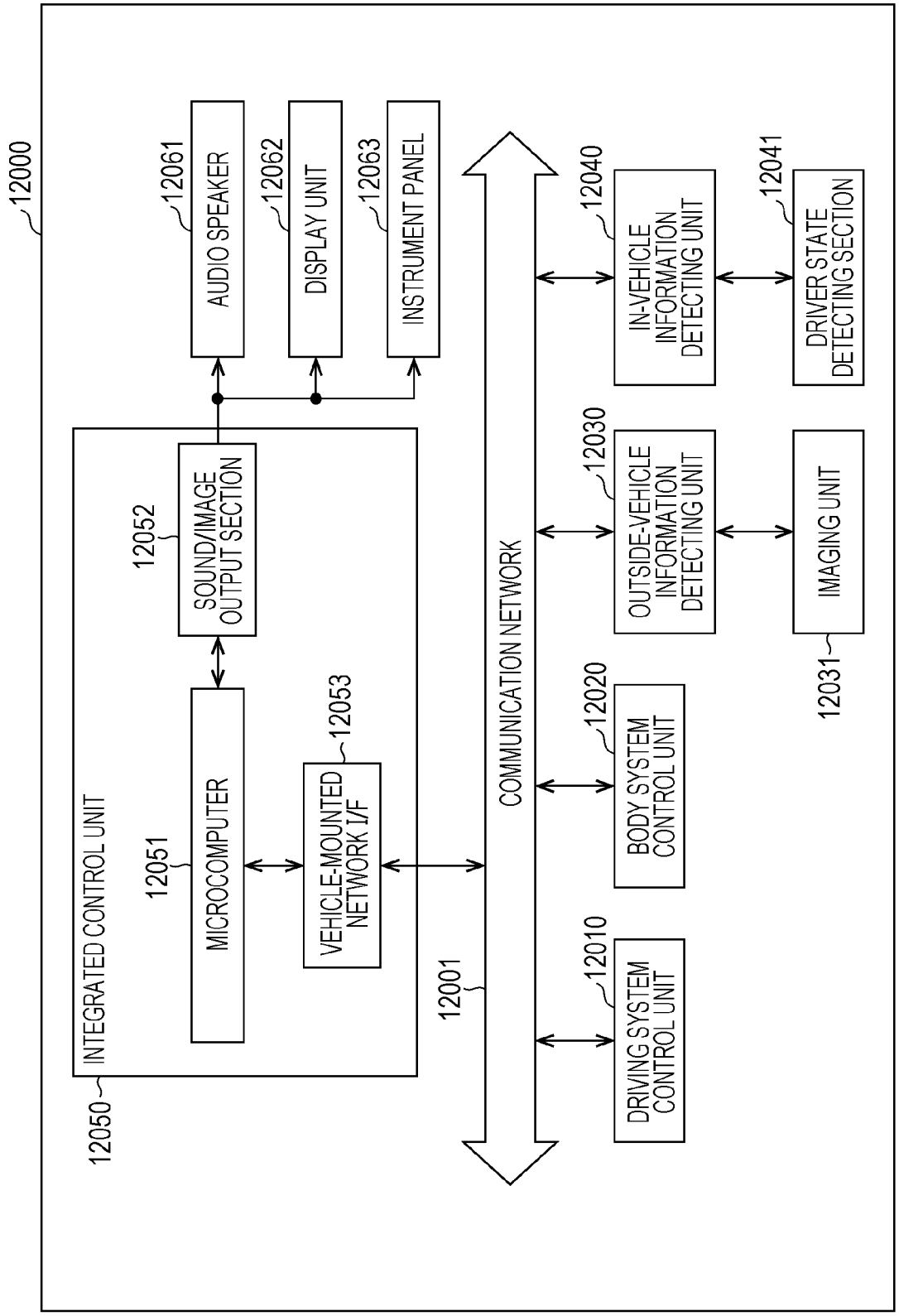
FIG. 20 is a block diagram depicting an example of schematic configuration of a vehicle control system.

FIG. 20 is a block diagram depicting an example of schematic configuration of a vehicle control system as an example of a mobile object control system to which the technology according to the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 20, an audio speaker 12061, a display unit 12062, and an instrument panel 12063 are illustrated as the output device. The display unit 12062 may, for example, include at least one of an on-board display or a head-up display.

Figure 21:
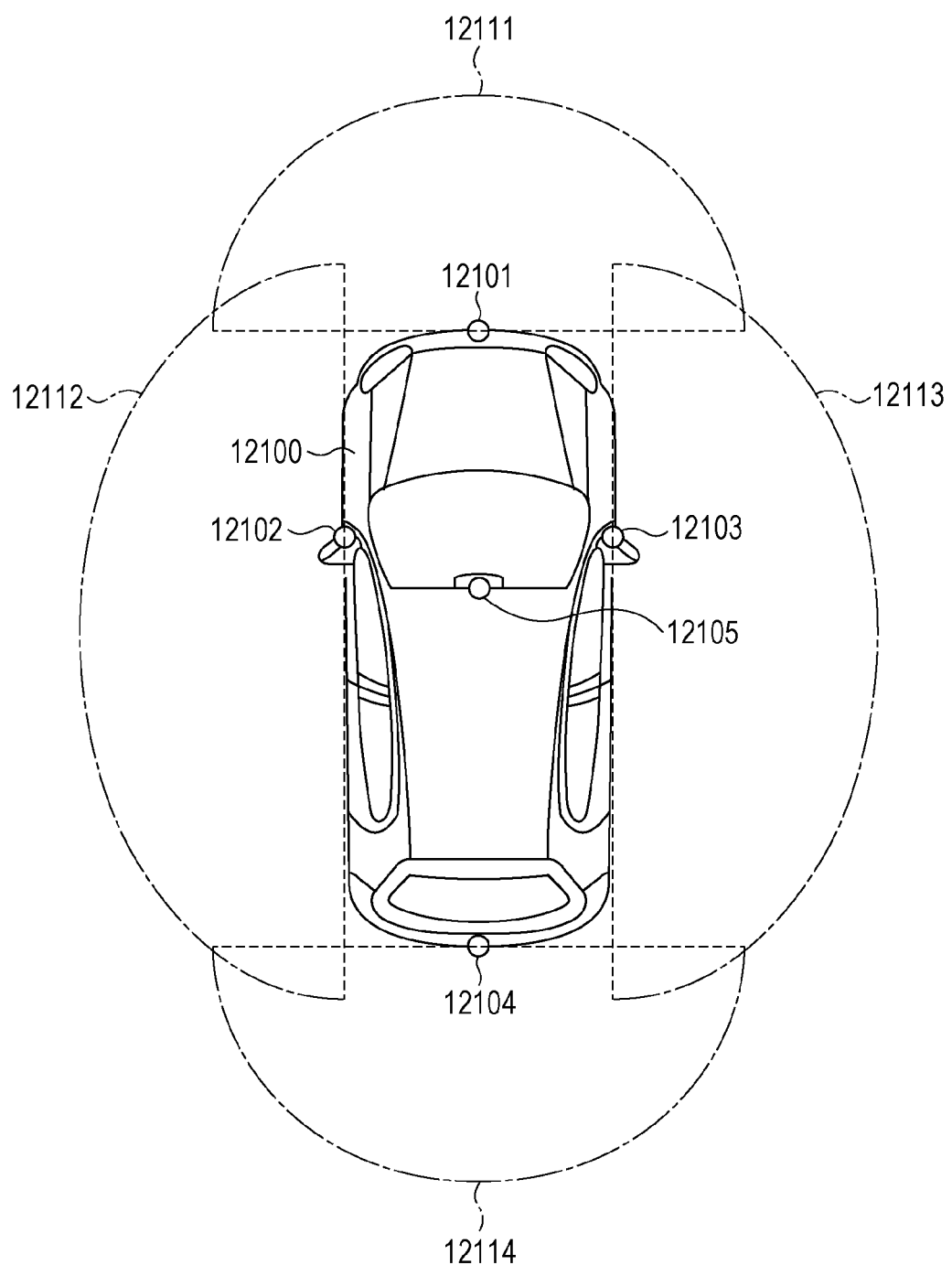
FIG. 21 is a diagram of assistance in explaining an example of installation positions of an imaging unit.

FIG. 21 is a diagram depicting an example of the installation position of the imaging unit 12031.

In FIG. 21, it includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle or the like. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The imaging unit 12105 disposed on an upper portion of the windshield within the interior of the vehicle is used mainly to detect a preceding vehicle, a pedestrian, an obstacle, a signal, a traffic sign, a lane, or the like.

Incidentally, FIG. 21 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of image pickup devices, or may be an image pickup device having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole or the like, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays.

The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. If the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. In addition, the sound/image output section 12052 may also control the display unit 12062 so that an icon or the like representing the pedestrian is displayed at a desired position.

As described above, an example of the vehicle control system to which the technology according to the present disclosure can be applied has been explained. The technology according to the present disclosure can be applied to the imaging unit 12031 among the configurations described above. Specifically, the imaging device 100 in FIG. 1 can be applied to the imaging unit 12031. By applying the technology according to the present disclosure to the imaging unit 12031, streaking can be suppressed and an easily-viewable captured image can be obtained. Fatigue in a driver can be thereby reduced.

Note that the above-described embodiments are examples for embodying the present technology, and matters in the embodiments each have a corresponding relationship with disclosure-specific matters in the claims. Likewise, the matters in the embodiments of the present technology and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Further, the advantageous effects described in the present specification are merely exemplary and are not limiting, and additional advantageous may be obtained.

Additionally, the present technology may also be configured as below.

(1) An amplification circuit including:
an amplification transistor configured to amplify an input signal;
a cascode transistor configured to, in a case where a drain-source voltage between a drain and a source is higher than a predetermined voltage, supply a substantially-constant drain current to a reference potential line with a predetermined reference potential via the amplification transistor; and
a control circuit configured to, in a case where an initialization instruction is issued, control the drain-source voltage to be a value higher than the predetermined voltage.

(2) The amplification circuit according to (1),
in which the control circuit
includes
a source follower transistor configured to supply an electric potential higher than an electric potential of a source to the drain of the cascode transistor, and
an input side switch configured to, in a case where the initialization instruction is issued, connect the source of the source follower transistor and an input node to which the input signal is input, and in a case where the initialization instruction is not issued, separate the source from the input node, and
the drain is connected to an output node to which the amplified input signal is output.

(3) The amplification circuit according to (2),
in which the control circuit further includes an output side switch configured to, in a case where the initialization instruction is issued, connect the gate of the source follower transistor and the output node, and in a case where the initialization instruction is not issued, separate the gate from the output node, and
the source follower transistor supplies an electric potential of the gate that is higher than an electric potential of the source, via the output side switch.

(4) The amplification circuit according to (3),
in which the control circuit further includes a bias control switch configured to, in a case where the initialization instruction is not issued, connect the gate of the source follower transistor and a bias potential supply source configured to supply a predetermined bias potential.

(5) An imaging device including:
an amplification transistor configured to amplify an input signal;
a current source transistor configured to, in a case where a drain-source voltage between a drain and a source is higher than a predetermined voltage, supply a substantially-constant drain current to a reference potential line with a predetermined reference potential via the amplification transistor;
a control circuit configured to, in a case where an initialization instruction is issued, control the drain-source voltage to be a value higher than the predetermined voltage; and
a pixel configured to photoelectrically convert incident light and supply the photoelectrically-converted incident light to the amplification transistor as the input signal.

(6) The imaging device according to (5),
in which the control circuit
includes
a source follower transistor configured to supply an electric potential higher than an electric potential of a source to the drain of the cascode transistor, and
an input side switch configured to, in a case where the initialization instruction is issued, connect the source of the source follower transistor and an input node to which the input signal is input, and in a case where the initialization instruction is not issued, separate the source from the input node, and
the drain is connected to an output node to which the amplified input signal is output.

(7) The imaging device according to (6),
further including a timing control unit configured to control an operation timing of the input side switch.

(8) The imaging device according to (7),
in which the control circuit further includes an output side switch configured to, in a case where the initialization instruction is issued, connect the gate of the source follower transistor and the output node, and in a case where the initialization instruction is not issued, separate the gate from the output node,
the source follower transistor supplies an electric potential of the gate that is higher than an electric potential of the source, via the output side switch, and
the timing control unit causes the input side switch and the output side switch to operate at different respective timings.

(9) The imaging device according to (8),
in which the control circuit further includes a bias control switch configured to, in a case where the initialization instruction is not issued, connect the gate of the source follower transistor and a bias potential supply source configured to supply a predetermined bias potential, and
the timing control unit causes the input side switch, the output side switch, and the bias control switch to operate at different respective timings.

(10) A control method of an amplification circuit, the control method including:
a procedure of amplifying an input signal; and
a control procedure of, in a case where an initialization instruction is issued, controlling a drain-source voltage between a drain and a source of a cascode transistor configured to supply a substantially-constant drain current to a reference potential line with a predetermined reference potential via the amplification transistor when the drain-source voltage is higher than a predetermined voltage, to be a value higher than the predetermined voltage.

REFERENCE SIGNS LIST

100 Imaging device
110 Optical unit
120 DSP circuit
130 Display unit
140 Operation unit 150 Bus
160 Frame memory
170 Storage unit
180 Power source unit
200 Solid-state image pickup device
210 Vertical driving unit
220 Pixel array unit
221 Pixel
222 Photodiode
223 Transfer transistor
224 Reset transistor
225 Floating diffusion layer
226, 334 Amplification transistor
227 Selection transistor
230 Timing control unit
240 DAC
250 Column signal processing unit
251 AD converter
252 Comparator
253 Counter
254 Transfer switch
255 Memory
260 Horizontal driving unit
300 Amplification circuit
311, 312, 325 Capacitor
320 Control circuit
321 Input side switch
322 Source follower transistor
323, 331 Current source transistor
324 Output side switch
326 Bias control switch
327, 335, 338, 343 Current source
328, 329, 336, nMOS transistor
332, 333 Cascode transistor
337, 339 pMOS transistor
340 Enable switch
344, 345, 346 Bias potential supply source
12031 Imaging unit

The invention claimed is:

1. An amplification circuit comprising:
an amplification transistor configured to amplify an input signal;
a cascode transistor configured to, in a case where a drain-source voltage between a drain and a source is higher than a predetermined voltage, supply a substantially-constant drain current to a reference potential line with a predetermined reference potential via the amplification transistor; and
a control circuit configured to, in a case where an initialization instruction is issued, control the drain-source voltage to be a value higher than the predetermined voltage.

2. The amplification circuit according to claim 1,
wherein the control circuit
includes
a source follower transistor configured to supply an electric potential higher than an electric potential of a source to the drain of the cascode transistor, and
an input side switch configured to, in a case where the initialization instruction is issued, connect the source of the source follower transistor and an input node to which the input signal is input, and in a case where the initialization instruction is not issued, separate the source from the input node, and
the drain is connected to an output node to which the amplified input signal is output.

3. The amplification circuit according to claim 2,
wherein the control circuit further includes an output side switch configured to, in a case where the initialization instruction is issued, connect the gate of the source follower transistor and the output node, and in a case where the initialization instruction is not issued, separate the gate from the output node, and
the source follower transistor supplies an electric potential of the gate that is higher than an electric potential of the source, via the output side switch.

4. The amplification circuit according to claim 3,
wherein the control circuit further includes a bias control switch configured to, in a case where the initialization instruction is not issued, connect the gate of the source follower transistor and a bias potential supply source configured to supply a predetermined bias potential.

5. An imaging device comprising:
an amplification transistor configured to amplify an input signal;
a current source transistor configured to, in a case where a drain-source voltage between a drain and a source is higher than a predetermined voltage, supply a substantially-constant drain current to a reference potential line with a predetermined reference potential via the amplification transistor;
a control circuit configured to, in a case where an initialization instruction is issued, control the drain-source voltage to be a value higher than the predetermined voltage; and
a pixel configured to photoelectrically convert incident light and supply the photoelectrically-converted incident light to the amplification transistor as the input signal.

6. The imaging device according to claim 5,
wherein the control circuit
includes
a source follower transistor configured to supply an electric potential higher than an electric potential of a source to the drain of the cascode transistor, and
an input side switch configured to, in a case where the initialization instruction is issued, connect the source of the source follower transistor and an input node to which the input signal is input, and in a case where the initialization instruction is not issued, separate the source from the input node, and
the drain is connected to an output node to which the amplified input signal is output.

7. The imaging device according to claim 6, further comprising
a timing control unit configured to control an operation timing of the input side switch.

8. The imaging device according to claim 7,
wherein the control circuit further includes an output side switch configured to, in a case where the initialization instruction is issued, connect the gate of the source follower transistor and the output node, and in a case where the initialization instruction is not issued, separate the gate from the output node,
the source follower transistor supplies an electric potential of the gate that is higher than an electric potential of the source, via the output side switch, and
the timing control unit causes the input side switch and the output side switch to operate at different respective timings.

9. The imaging device according to claim 8,
wherein the control circuit further includes a bias control switch configured to, in a case where the initialization instruction is not issued, connect the gate of the source follower transistor and a bias potential supply source configured to supply a predetermined bias potential, and the timing control unit causes the input side switch, the output side switch, and the bias control switch to operate at different respective timings.

10. A control method of an amplification circuit, the control method comprising:

a procedure of amplifying an input signal; and a control procedure of, in a case where an initialization instruction is issued, controlling a drain-source voltage between a drain and a source of a cascode transistor configured to supply a substantially-constant drain current to a reference potential line with a predetermined reference potential via the amplification transistor when the drain-source voltage is higher than a predetermined voltage, to be a value higher than the predetermined voltage.

11. An amplification circuit comprising:

an amplification transistor configured to amplify an input signal;

a cascode transistor configured to, in a case where a drain-source voltage between a drain and a source is higher than a predetermined voltage, supply a substantially-constant drain current to a reference potential line with a predetermined reference potential via the amplification transistor; and a control circuit configured to, in a case where an initialization instruction is issued, control the drain-source voltage to be a value higher than the predetermined voltage, wherein when the drain-source voltage is at the value, the cascode transistor operates in a saturated region.

12. The amplification circuit according to claim 11, wherein the control circuit includes a source follower transistor configured to supply an electric potential higher than an electric potential of a source to the drain of the cascode transistor, and an input side switch configured to, in a case where the initialization instruction is issued, connect the source of the source follower transistor and an input node to which the input signal is input, and in a case where the initialization instruction is not issued, separate the source from the input node, and the drain is connected to an output node to which the amplified input signal is output.

13. The amplification circuit according to claim 12, wherein the control circuit further includes an output side switch configured to, in a case where the initialization instruction is issued, connect the gate of the source follower transistor and the output node, and in a case where the initialization instruction is not issued, separate the gate from the output node, and the source follower transistor supplies an electric potential of the gate that is higher than an electric potential of the source, via the output side switch.

14. The amplification circuit according to claim 13, wherein the control circuit further includes a bias control switch configured to, in a case where the initialization instruction is not issued, connect the gate of the source follower transistor and a bias potential supply source configured to supply a predetermined bias potential.

15. An imaging device comprising the amplification circuit according to claim 11.

16. The imaging device according to claim 15, wherein the control circuit includes a source follower transistor configured to supply an electric potential higher than an electric potential of a source to the drain of the cascode transistor, and an input side switch configured to, in a case where the initialization instruction is issued, connect the source of the source follower transistor and an input node to which the input signal is input, and in a case where the initialization instruction is not issued, separate the source from the input node, and the drain is connected to an output node to which the amplified input signal is output.

17. The imaging device according to claim 16, wherein the control circuit further includes an output side switch configured to, in a case where the initialization instruction is issued, connect the gate of the source follower transistor and the output node, and in a case where the initialization instruction is not issued, separate the gate from the output node, and the source follower transistor supplies an electric potential of the gate that is higher than an electric potential of the source, via the output side switch.

18. The imaging device according to claim 17, wherein the control circuit further includes a bias control switch configured to, in a case where the initialization instruction is not issued, connect the gate of the source follower transistor and a bias potential supply source configured to supply a predetermined bias potential.

* * * * *